(12) United States Patent
Khvalkovskiy et al.

(10) Patent No.: US 9,076,954 B2
(45) Date of Patent: Jul. 7, 2015

(54) METHOD AND SYSTEM FOR PROVIDING MAGNETIC MEMORIES SWITCHABLE USING SPIN ACCUMULATION AND SELECTABLE USING MAGNETOELECTRIC DEVICES

(71) Applicant: Samsung Electronics Co., LTD., Gyeonggi-do (KR)

(72) Inventors: Alexey Vasilyevitch Khvalkovskiy, Milpitas, CA (US); Dmytro Apalkov, San Jose, CA (US); Vladimir Nikitin, Campbell, CA (US); Mohamad Towfik Krounbi, San Jose, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/097,492

(22) Filed: Dec. 5, 2013

(65) Prior Publication Data

US 2015/0041934 A1    Feb. 12, 2015

Related U.S. Application Data

(60) Provisional application No. 61/863,835, filed on Aug. 8, 2013.

(51) Int. Cl.
*G11C 11/00* (2006.01)
*H01L 43/02* (2006.01)

(52) U.S. Cl.
CPC ..................................... *H01L 43/02* (2013.01)

(58) Field of Classification Search
CPC .. G11C 11/16; G11C 11/161; G11C 11/1675; G11C 11/02; G11C 11/14; G11C 11/1673; G11C 16/06; G11C 16/3454; G11C 7/20
USPC .............. 365/158, 171, 173, 172, 185.22, 97, 365/148
See application file for complete search history.

(56) References Cited

U.S. PATENT DOCUMENTS 6,848,169 B2   2/2005   Shin
7,009,877 B1   3/2006   Huai
(Continued)

FOREIGN PATENT DOCUMENTS

WO   WO2012/159078   11/2012
WO   WO2013/025994    2/2013

OTHER PUBLICATIONS

"Magnetization switching of an MgO/Co/Pt layer by in-plane current injection," Can Onur, Kevin Avci, Ioan Garello, Miron Mihai, Gilles Gaudin, Stephane Auffret, Olivier, Boulle, and Pietro Gambardella, Applied Physics Letters 100, 212404 May 21, 2012.
(Continued)

*Primary Examiner* — Thong Q Le
(74) *Attorney, Agent, or Firm* — Convergent Law Group LLP

(57) ABSTRACT

A magnetic memory is described. In one aspect, the magnetic memory includes magnetic junctions and at least one semi-spin valve (SSV) line adjacent to the magnetic junctions. Each magnetic junction includes a magnetic free layer. The SSV line(s) include a ferromagnetic layer and a nonmagnetic layer between the ferromagnetic layer and the magnetic junctions. The SSV line(s) are configured to exert a spin accumulation induced torque on at least a portion of the magnetic junctions due to an accumulation of spin polarized current carriers from a current that is substantially in-plane. The free layer is configured to be written using at least the spin accumulation induced torque. In another aspect, the magnetic memory includes magnetic memory cells and at least one spin torque (ST) line that is analogous to the SSV line. Each magnetic memory cell includes magnetic junction(s) analogous to those above and magnetoelectric selection device(s).

19 Claims, 11 Drawing Sheets

(56) References Cited

U.S. PATENT DOCUMENTS

| | | | |
|---|---|---|---|
| 7,943,399 B2 | 5/2011 | Sun | |
| 7,957,107 B2 | 6/2011 | Carey | |
| 2013/0343117 A1* | 12/2013 | Lua et al. | 365/158 |

OTHER PUBLICATIONS

"MRAM Device Incorporating Single-Layer Switching via Rashba-Induced Spin Torque," Jie Guo, Seng Ghee Tan, Mansoor Bin, Abdul Jalil, Kwaku Eason, Sunny Yan, Hwee Lua, Sbiaa Rachid, and Hao Meng, IEEE Transactions on Magnetics, vol. 47, No. 10, October 2011.

"Spin-Valve and Pseudo-Spin-Valve Device Switching for Giant Magnetoresistive Random Access Memory Applications," R. R. Katti, D. Zou, D.Reed, and H.Kaakani, IEEE Transactions on Magnetics, vol. 39, No. 5, Sep. 2003.

"Voltage-Controlled Magneticanisotropy in Spintronic Devices," P.K.Amiri and K.L.Wang, World Scientific, vol. 2, No. 3, 12400002, Oct. 29, 2012.

"Gate voltage modulation of spin-Hall-torque-driven magnetic switching," Luqiao Liu, Chi-Feng Pai, D. C. Ralph and R. A. Buhrman, Kavli Institute, Cornell Unversity.

* cited by examiner

METHOD AND SYSTEM FOR PROVIDING MAGNETIC MEMORIES SWITCHABLE USING SPIN ACCUMULATION AND SELECTABLE USING MAGNETOELECTRIC DEVICES

CROSS-REFERENCE TO RELATED APPLICATIONS

This application claims the benefit of provisional Patent Application Ser. No. 61/863,835, filed Aug. 8, 2013, entitled METHOD AND SYSTEM FOR PROVIDING MAGNETIC MEMORIES SWITCHABLE USING SPIN ACCUMULATION AND SELECTABLE USING MAGNETOELECTRIC DEVICES, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. For example, FIG. 1 depicts a conventional magnetic tunneling junction (MTJ) 10 as it may be used in a conventional STT-RAM. The conventional MTJ 10 typically resides on a bottom contact 11, uses conventional seed layer(s) 12 and includes a conventional antiferromagnetic (AFM) layer 14, a conventional first pinned, or reference layer 16, a conventional tunneling barrier layer 18 and a conventional free layer 20. Also shown is top contact 30.

The conventional reference layer 16 and the conventional free layer 20 are magnetic. The conventional free layer 20 has a changeable magnetization 21. The magnetization 17 of the conventional reference layer 16 is fixed, or pinned, in a particular direction, typically by an exchange-bias interaction with the AFM layer 14. The magnetizations 25 and 17 of the conventional free layer 20 and pinned layer 16, respectively, may be in-plane as shown or perpendicular to the plane. The dual MTJ 10 may have enhanced spin torque if the reference layer 16 and 26 are fixed in the dual state (magnetic moments 17 and 25 of reference layers 16 and 26 antiparallel). However, a dual MTJ 10 in the dual state may have reduced magnetoresistance. In contrast, if the reference layers 16 and 26 are fixed in the antidual state (magnetic moments 17 and 25 of reference layers 16 and 26 parallel) the dual MTJ 10 may have enhanced magnetoresistance. In the antidual configuration, however, the spin-transfer torque contributions from two reference layers 16 and 26 counteract each other. As a result, spin transfer based switching may require a larger write current for the antidual state.

To switch the magnetization 21 of the conventional free layer 20, a current is driven perpendicular to plane (in the z-direction). The current carriers are spin polarized and exert a torque on the magnetization 21 of the conventional free layer 20 as the current carriers pass through the conventional free layer 20. The spin transfer torque on the magnetic moment 21 of the conventional free layer 20 is initially small when the magnetic moment 21 is parallel to the easy axis (the stable state). When a sufficient current is driven from the top contact 30 to the bottom contact 11, the magnetization 21 of the conventional free layer 20 may switch to be parallel to the magnetization 17 of the conventional reference layer 16. When a sufficient current is driven from the bottom contact 11 to the top contact 30, the magnetization 21 of the free layer may switch to be antiparallel to that of the reference layer 16. The differences in magnetic configurations correspond to different magnetoresistances and thus different logical states (e.g. a logical "0" and a logical "1") of the conventional MTJ 10.

In applications such as STT-RAM, the memory cell including the conventional magnetic junction 10 is selected. Typically, this is accomplished by configuring each memory cell to include both the conventional magnetic junction 10 and a selection transistor (not shown in FIG. 1). When the transistor is turned on, for example by a voltage applied to the transistor's gate, current can be driven through the conventional dual magnetic junction 10 in the CPP configuration. This current can be a read current or a write current for STT writing. Data may thus be written to or read from the conventional MTJ 10.

Although the conventional dual MTJ 10 may be written using spin transfer and used in an STT-RAM, there are drawbacks. For example, very high currents may be required to achieve switching of the conventional free layer 20 at a sufficiently low write error rate. These currents may require a larger selection transistor and/or may damage the conventional dual magnetic junction 10. Further, to obtain such a high spin transfer torque, the reference layers 16 and 26 have their magnetic moments 17 and 25 in the antidual state (fixed in opposite directions). When in this state, there is a cancellation of magnetoresistance during a read operation, which lowers the read signal. Such a reduction in signal is undesirable.

Accordingly, what is needed is a method and system that may improve the performance of the spin transfer torque based memories. The method and system described herein address such a need.

BRIEF SUMMARY OF THE INVENTION

A magnetic memory is described. In one aspect, the magnetic memory includes magnetic junctions and at least one semi-spin valve (SSV) line adjacent to the magnetic junctions. Each magnetic junction includes a magnetic free layer. The SSV line(s) include a ferromagnetic layer and a nonmagnetic layer between the ferromagnetic layer and the magnetic junctions. The SSV line(s) are configured to exert a spin accumulation induced torque on at least a portion of the magnetic junctions due to an accumulation of spin polarized current carriers from a current that is substantially in-plane. The free layer is configured to be written using at least the spin accumulation induced torque. In another aspect, the magnetic memory includes magnetic memory cells and at least one spin torque (ST) line that is analogous to the SSV line. Each magnetic memory cell includes magnetic junction(s) analogous to those above and magnetoelectric selection device(s).

DETAILED DESCRIPTION OF THE INVENTION

Figure 1:
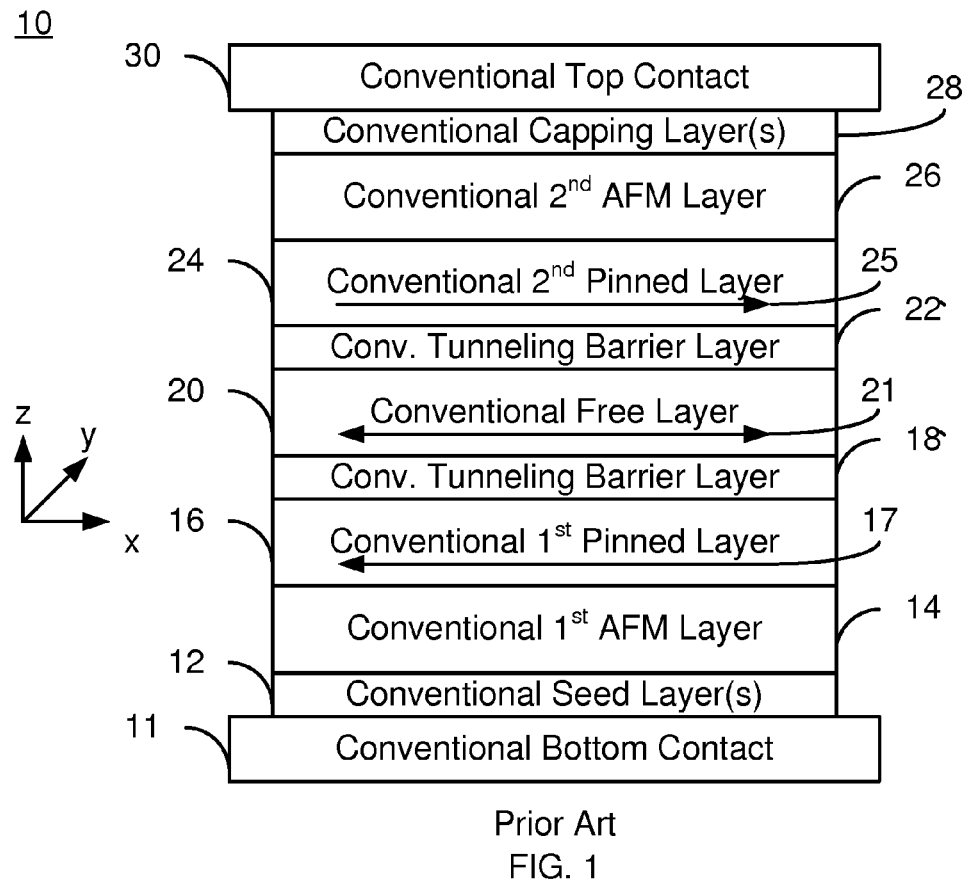
FIG. 1 depicts a conventional magnetic junction.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments describe methods and systems for providing a magnetic memory. In one aspect, the magnetic memory includes magnetic junctions and at least one semi-spin valve (SSV) line adjacent to the magnetic junctions. Each magnetic junction includes a magnetic free layer. The SSV line(s) include a ferromagnetic layer and a nonmagnetic layer between the ferromagnetic layer and the magnetic junctions. The SSV line(s) are configured to exert a spin accumulation induced torque on at least a portion of the magnetic junctions due to an accumulation of spin polarized current carriers from a current that is substantially in-plane. The free layer is configured to be written using at least the spin accumulation induced torque. In another aspect, the magnetic memory includes magnetic memory cells and at least one spin torque (ST) line that is analogous to the SSV line. Each magnetic memory cell includes magnetic junction(s) analogous to those above and magnetoelectric selection device(s).

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of spin-orbit interaction, accumulation of spin polarized current, the spin transfer phenomenon and other physical phenomenon. Consequently, one of ordinary skill in the art will readily recognize that theoretical explanations of the behavior of the method and system are made based upon this current understanding of such physical phenomenon. However, the method and system described herein are not dependent upon a particular physical explanation. For example, other mechanisms for spin accumulation may occur in addition to or in lieu of those discussed herein. However, such mechanisms not inconsistent with the structures described herein may be considered to be in accordance with the exemplary embodiments discussed. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or other structures having particular layers. However, one of ordinary skill in the art will readily recognize that magnetic junctions and/or other structures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions. However, one of ordinary skill in the art will readily recognize that the method and system are consistent with the use of magnetic memories having multiple magnetic junctions. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
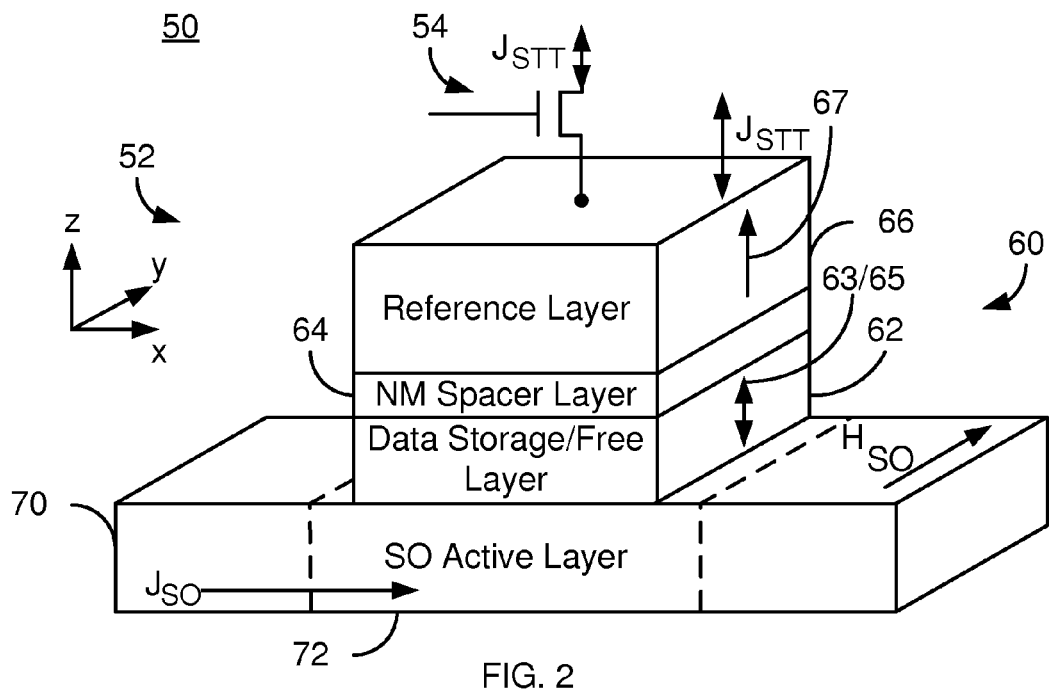
FIG. 2 depicts an exemplary embodiment of a magnetic junction switched using spin accumulation induced torque due to the spin-orbit interaction.

FIG. 2 depicts an embodiment of a portion of a recently developed magnetic memory 50 that utilizes spin accumulation in switching. The magnetic memory 50 may be used in devices that utilize RAM, particularly MRAM, including but not limited to cellular phones, other mobile devices and computing devices. More specifically, the memory 50 utilizes spin orbit interaction based switching. For clarity, FIG. 2 is not to scale. In addition, portions of the magnetic memory 50 such as bit lines, word lines, row selectors and column selectors are not shown or not labeled as such. The magnetic memory 50 includes a magnetic storage cell 52. The magnetic storage cell 52 may be one of a number of magnetic storage cells ordered in an array. Each of the magnetic storage cells includes a selection device 54 and a magnetic junction 60. In some embodiments, multiple magnetic junctions 60 and/or multiple selection devices 54 may be used in a single cell. Also shown is bus 70 including a spin-orbit interaction (SO) active layer 72. The common bus 70 may stretch across multiple storage cells, in which case only one of such cells is shown in FIG. 2. In the embodiment shown, the material(s) forming the SO active layer 72 are only in the vicinity of the storage cell 52. Thus, other materials, including but not limited to higher conductivity and/or nonmagnetic materials, may be used between the cells 52. However, in other embodiments, the common bus 70 may consist of the SO active layer 72. In still other embodiments, the SO active layer 72 may be separate from the common bus 70. For example, the SO active layer 72 may reside between the magnetic junction 60 and the common bus 70. In other embodiments, the SO active layer 72 may be included as part of the storage cell 52 and the common bus 70 might be omitted.

In the embodiment shown, the magnetic junction 60 includes a data storage/free layer 62, a nonmagnetic spacer layer 64, and a reference layer 66. The spacer layer 64 is nonmagnetic. In some embodiments, the spacer layer 64 is an insulator, for example a tunneling barrier. In such embodiments, each spacer layer 64 may include crystalline MgO, which may enhance the TMR and spin transfer efficiency of and/or the spin-orbit interaction for the magnetic junction 60. In other embodiments, the spacer layer 64 may be a conductor, such as Cu. In alternate embodiments, the spacer layer 64 might have another structure, for example a granular layer including conductive channels in an insulating matrix.

The free layer 62 is a free layer 62 having a magnetic moment 65. The magnetic moment 65 is switchable and, when the magnetic junction 60 is quiescent (not being switched), lies along the easy axis 63 of the free layer 62. The magnetic moment 65 and easy axis 63 are thus depicted using a single double headed arrow. The reference layer 66 has a magnetic moment 67 that is substantially fixed in place. In some embodiments, the magnetic junction 60 also includes a pinning layer, such as an antiferromagnetic layer (not shown) that fixes the magnetic moment of the reference layer 66 in place. In other embodiments, the magnetic moment of the reference layer 66 is fixed in another manner. The free and reference layers 62 and 66 are ferromagnetic and thus may include one or more of Fe, Ni, and Co. The magnetic moments 63 and 67 of the layers 62 and 66, respectively, may be perpendicular to plane as shown. Thus, each of the layers 62 and/or 66 may have a perpendicular anisotropy field that exceeds its out-of-plane demagnetization field (typically a significant fraction of $4\pi M_s$). In other embodiments, the magnetic moments 63 and/or 67 are in-plane.

The magnetic moment of the free layer 62 is switched using the spin-orbit interaction effect, described below. In some embodiments, the free layer 62 may be switched using a combination of effects. For example, the magnetic moment of the free layer 62 may be switched using spin transfer torque as a primary effect that may be assisted by torque induced by the spin-orbit interaction. However, in other embodiments, the primary switching mechanism is torque induced by the spin-orbit interaction. In such embodiments, another effect including but not limited to spin transfer torque, may assist in switching and/or selecting the magnetic junction 60. In still other embodiments, the free layer 62 magnetic moment is switched using only the spin-orbit interaction effect.

The SO active layer 72 is a layer that has a strong spin-orbit interaction and that can generate an accumulation of current carriers usable in switching the magnetic moment of the free layer 72. A current is driven in-plane through the SO active layer 72. This may be achieved by driving a current (e.g. with a current density $J_{SO}$ shown in FIG. 2) through the common bus 70. Due to the spin-orbit interaction in the SO active layer 72, the current flowing through this layer may result in the accumulation of spin polarized charge carriers (e.g. electrons) near the free layer 62. The accumulated charge carriers give rise to a spin-orbit field $H_{SO}$ proportional to the current density $J_{SO}$. For some embodiments, the spin-orbit field $H_{SO}$ is parallel to a vector $p_{SO}$, which is determined by the material parameters and geometry of the SO active layer 72 and by the direction of the current $J_{SO}$. For some other embodiments $H_{SO}$ is parallel to a vector $[M \times p_{SO}]$, where M is vector of the magnetic moment 65. For some other embodiments it is proportional to a linear combination of the vectors $[M \times p_{SO}]$ and $p_{SO}$. This spin-orbit field $H_{SO}$ is equivalent to the spin-orbit torque, $T_{SO}$, on the magnetic moment 65. The spin-orbit torque on the free layer 62 is given by $T_{SO} = -\gamma [M \times H_{SO}]$, where M is the vector of the magnetic moment 65. This mutually correlated torque and field are thus interchangeably referred to herein as spin-orbit field and spin-orbit torque. This terminology differentiates this spin-orbit (SO) torque from the more conventional spin-transfer torque (STT). Spin-orbit (SO) torque occurs for a current driven in-plane in the SO active layer 72, the resulting charge carriers accumulated near the data storage layer 62 and a spin-orbit interaction. For example, in the embodiment shown, the spin-orbit torque occurs for the current density $J_{SO}$. In contrast, spin transfer torque (STT) is due to a perpendicular-to-plane current flowing through the free layer 62, spacer layer 64 and reference layer 66, that injects spin polarized charge carriers into the free layer 62. In the embodiment shown, the spin transfer torque is due to the current density $J_{STT}$.

The spin-orbit torque $T_{SO}$ may rapidly deflect the magnetic moment of the free layer 62 from its equilibrium state parallel to the easy axis. The current flowing through the SO active layer 72 may have very large current density (up to, or on the order of $10^8$ A/cm$^2$) because the current is in-plane. This current density for the SO active layer 72 is much larger than the current density which flows through the barrier of the MTJ cell as the latter is limited by the size of the cell transistor and MTJ breakdown voltage. Thus, the perpendicular-to-plane current through the magnetic junction 60 typically does not exceed a few MA/cm$^2$. Therefore, the spin-orbit torque $T_{SO}$ generated by $J_{SO}$ can be significantly larger than the maximum STT torque generated by the current flowing through the MTJ cell. As a result, the spin-orbit torque $T_{SO}$ may tilt the magnetization of the free layer considerably faster than conventional STT torque. In some embodiments, another mechanism such as spin transfer may be used to complete switching. In other embodiments, switching can be completed using spin-orbit torque. The spin-orbit field/spin-orbit torque generated may thus be used in switching the magnetic moment of the free layer 62.

In order to select the magnetic memory cell 52 being written, a selection device is used. In some embodiments, the selection device is a selection transistor 54 that allows current to be driven through the magnetic junction 60 for STT switching. In other embodiments, other mechanisms may be used. For example, the region of the SO active layer 72 may be heated or otherwise controlled to reduce or enhance the accumulation of spins due to the SO interaction. Failure of the spins to accumulate near the free layer 62 results in a reduced SO torque and, therefore, an inability to switch the magnetic moment 65 of the free layer 62.

In some embodiments, the SO interaction may include some combination of two effects: the spin Hall effect and the Rashba effect. In many SO active layers, the spin-orbit interaction includes both the spin Hall effect and the Rashba effect, but one of the two dominates. Other spin-orbit effects may also be employed. The spin Hall effect is generally considered to be a bulk effect. Typically for the spin Hall effect the vector $p_{SO}$ at a given surface of the spin-orbit active line 72 is directed perpendicular to the direction of the current and to the normal vector to that surface. Materials that exhibit the spin Hall effect often include heavy metals or materials doped by heavy metals. For example, such materials can be selected from at least one of A and M doped by B. A includes Y, Zr, Nb, Mo, Tc, Ru, Rh, Pd, Cd, In, Sb, Te, Hf, Ta (including high-resistive amorphous β-Ta), W, Re, Os, Ir, Pt, Au, Hg, Tl, Pb, Bi, Po, At, and/or their combinations; M includes at least one of Al, Ti, V, Cr, Mn, Cu, Zn, Ag, Hf, Ta, W, Re, Pt, Au, Hg, Pb, Si, Ga, GaMn or GaAs, and B includes at least one of V, Cr, Mn, Fe, Co, Ni, P, S, Zn, Ga, Ge, As, Se, Y, Zr, Nb, Mo, Tc, Ru, Rh, Pd, Ag, Cd, In Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb. In some embodiments, the SO active layer 72 may include or consist of Ir doped Cu and/or Bi doped Cu. The doping is generally in the range of 0.1 through 10 atomic percent. In other embodiments, other materials may be used.

Another source of the spin-orbit field $H_{SO}$ in the SO active layer 72 can be related to the spin-orbit interaction at the interfaces. The magnitude of the spin-orbit field in this case is often related to the magnitude of the crystal field, which is often high at the interface. Due to the mismatch of the lattice parameters of the adjacent layers, the presence of heavy metals at the interface, and other effects, the spin-orbit interaction can be considerably large at some interfaces. A strong spin-orbit effect at the interface associated with the gradient of the crystal field in the perpendicular to the interface plane direction is often referred to as the Rashba effect. As used herein, however, the Rashba effect refers to a spin-orbit interaction at the interface regardless of its origin and direction. Note that in at least some embodiments, the interfaces for the SO active layer 72 should differ to get a sizable Rashba affect. For example, the Rashba effect may occur for the SO active layer 72 being/having a Pt layer adjoining the magnetic junction 60, a Co layer for the free layer 62, and an aluminum oxide or MgO nonmagnetic layer 64. In some embodiments, other materials may be used.

The unit vector of spin-polarization $p_{SO}$ for the Rashba effect is typically perpendicular to the crystal field and the current direction. Many SO active layers 72 have a crystal field perpendicular to the plane of the layer 70. As such, the spin-orbit polarization would be in-plane, for example in the direction of $H_{SO}$ in FIG. 2. Alternatively, the SO active layer 72 may have a crystalline field in-plane or tilted to the plane. As such, the SO active layer 72 has a spin-orbit polarization perpendicular to plane (not shown in FIG. 2) or correspondingly tilted to the plane (not shown in FIG. 2). In such embodiments, the SO active layer 72 may be a surface alloy. For example the SO active layer 72 may include at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb, and/or their combinations. In other embodiments, the SO active layer 72 may include surface alloys of A/B, e.g. atoms of A residing on a (111) surface of a host material B such that on the top atomic layers are a mixture of A and B. A includes at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb, and B includes at least one of Si, Zn, Cu, Ag, Au, W, Zn, Cr, Pt, Pd. In many embodiments, A includes two or three different materials. In some embodiments, at least 0.1 to not more than three monolayers of A are deposited. In some such embodiments approximately ⅓ of a monolayer of A is deposited. In some embodiments, this can be one or more of substitutional Bi/Ag, substitutional Pb/Ag, substitutional Sb/Ag, substitutional Bi/Si, substitutional Ag/Pt, substitutional Pb/Ge, substitutional Bi/Cu, and a bilayer including a layer residing on a (111) surface of Au, Ag, Cu or Si. In other embodiments, the SO active layer 72 may include compounds like InGaAs, HgCdTe or bilayers LaAlO$_3$/SrTiO$_3$, LaTiO$_3$/SrTiO$_3$. In other embodiments, other materials may be used. For some embodiments, Rashba effect would result in the spin-orbit torque $T_{SO}$ and corresponding spin-orbit field $H_{SO}$ on the free layer 62.

Thus, the magnetic memory 50 may use the spin-orbit interaction, charge carriers accumulated due to the spin-orbit interaction and the corresponding spin-orbit field in switching of the magnetic moment of the free layer 62. In some embodiments, the SO active layer 72 may rely one or both of the spin-Hall effect and the Rashba effect to generate the spin-orbit field $H_{SO}$. Consequently, as used herein, terms such as the "spin-orbit effect", "spin-orbit field and/or "spin-orbit interactions" may include spin-orbit coupling via the Rashba effect, the spin Hall effect, some combination of the two effects, and/or some other spin-orbit interaction or spin-orbit interaction-like effect. The spin-orbit fields can exert a torque on the magnetic moment of the data storage/free layer 72. In some embodiments, the spin-orbit field assists in switching the magnetic moment of the free layer 62. Another mechanism, such as spin transfer torque, is the primary switching mechanism. In other embodiments, the spin-orbit torque is the primary switching mechanism for the magnetic moment of the free layer 62. However, in some such embodiments, the spin-orbit torque may be assisted by another mechanism such as spin transfer torque. The assistance may be in switching the magnetic moment of the free layer 62 and/or in selecting the magnetic junction to be switched.

Although the previously developed memory 50 functions, one of ordinary skill in the art will recognize that further improvements are desired.

Figure 3:
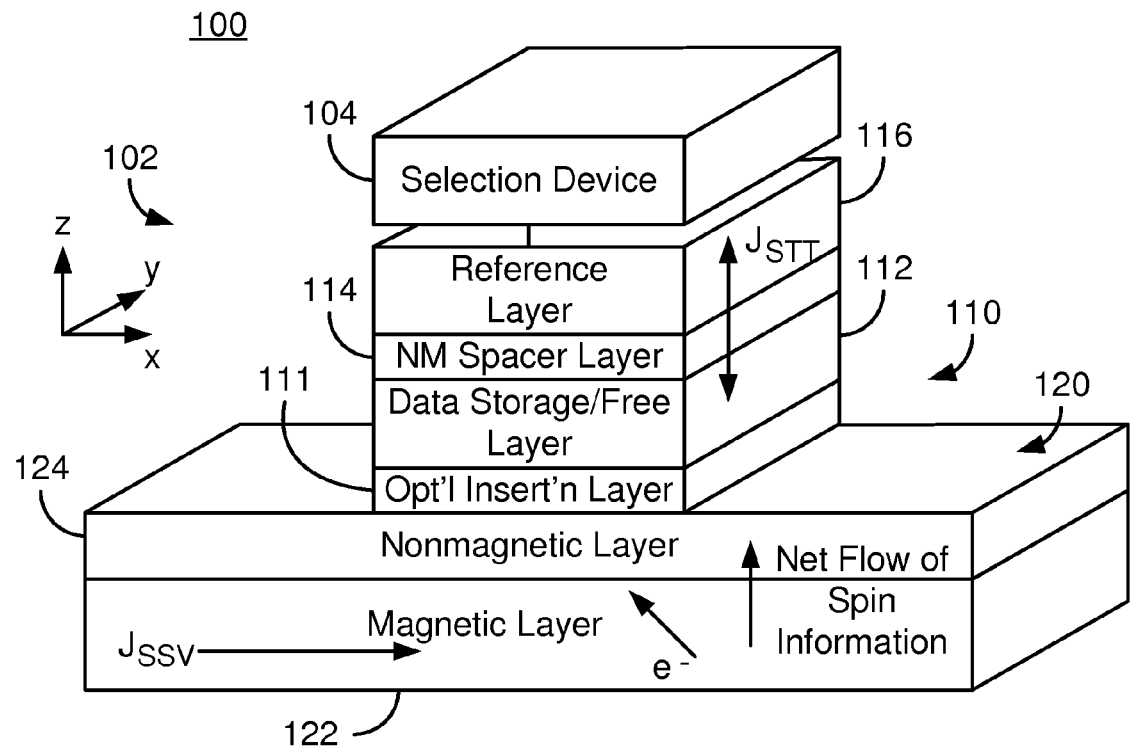
FIG. 3 depicts an exemplary embodiment of a magnetic junction switched using spin-orbit interaction.

FIG. 3 depicts a perspective view of an exemplary embodiment of a portion of a magnetic memory 100 that includes magnetic junction 110 switched using accumulated charge carriers. The magnetic memory 100 may be used in devices that utilize RAM, particularly MRAM, including but not limited to cellular phones, other mobile devices and computing devices. For clarity, FIG. 3 is not to scale. In addition, portions of the magnetic memory 100 such as bit lines, word lines, row selectors and column selectors are not shown or not labeled as such. The magnetic memory 100 includes a semi-spin valve (SSV) line 120 and a magnetic storage cell that has at least one magnetic junction 110 and selection device 104 therein. In some embodiments, the magnetic storage cell may have additional components including but not limited to another magnetic junction and one or more additional selection devices. The magnetic storage cell may be one of a number of magnetic storage cells ordered in an array. Similarly, multiple SSV lines 120 may be used in the magnetic memory 100.

In the embodiment shown, the magnetic junction 110 includes a free layer 112, a nonmagnetic spacer layer 114, and a reference layer 116. Also shown is an optional insertion layer 111. The optional insertion layer may be a conductive nonmagnetic layer that may be used to control the torque induced on the free layer 112 due to an in-plane current driven through the SSV line 120. The optional insertion layer 111 may also have a resistivity configured to achieve the desired spin accumulation, described below. However, in other embodiments, the optional insertion layer 111 may be omitted. In either embodiment, the resistance of the SSV line 120 may be desired to be less than the resistance of the magnetic junction 110.

The spacer layer 114 is nonmagnetic. In some embodiments, the spacer layer 114 is an insulator, for example a tunneling barrier. In such embodiments, each spacer layer 114 may include crystalline MgO, which may enhance the TMR and spin transfer efficiency for the magnetic junction 110. In other embodiments, the spacer layer 114 may be a conductor, such as Cu. In alternate embodiments, the spacer layer 114 might have another structure, for example a granular layer including conductive channels in an insulating matrix.

The free layer 112 and reference layer 116 are magnetic and thus may include Fe, Co and/or Ni. In some embodiments, one or more of the layers 112 and 116 may be multilayers. For example, the reference layer 116 may include multiple ferromagnetic layers interleaved with and sandwiching one or more nonmagnetic layers. In such embodiments, the ferromagnetic layers may be antiferromagnetically aligned. Thus, the reference layer 116 may be a synthetic antiferromagnet (SAF). The magnetic moments of the reference layer 116 and free layer 112 may be in-plane (e.g. in the x-y plane), perpendicular to plane (e.g. along the z-axis) or canted at some angle from the z-axis. Thus, each of the layers 112 and/or 116 may have a perpendicular anisotropy field that exceeds its out-of-plane demagnetization field (typically a significant fraction of $4\pi M_s$).

The magnetic moment of the reference layer 116 is desired to be substantially fixed, or pinned, in place during operation of the magnetic memory 100. For example, the magnetic moment may be fixed in place using a pinning layer (not shown in FIG. 3) such as an antiferromagnetic layer that adjoins the reference layer 116. Alternatively, the reference layer 116 magnetic moment may be fixed using another mechanism. In contrast, the magnetic moment of the free layer 112 is switchable using spin accumulation and, in at least some embodiments, spin transfer torque.

The magnetic memory cell 102 also includes the selection device 104. In the embodiment shown, the magnetic junction 110 is between the selection device 104 and the SSV line 120. However, in other embodiments, the physical locations of the devices may differ. In the embodiment shown, the selection device 104 may include a transistor. However, in other embodiments, the selection device 104 may be or include another component. For example, in some embodiments, the selection device 104 may be used to enhance and/or reduce the spin accumulation (described below) used in switching the free layer 112. In such embodiments, the selection device 104 may perform the selection functions using resistance, temperature, and/or magnetoelectric characteristics. In such embodiments, the selection device 104 may be located closer to the SSV line 120. In even other embodiments more than one selection device 104 may be used. For example two selection devices 104 located above and below the magnetic junction 110.

The SSV line 120 includes a magnetic layer 122 and a nonmagnetic layer 124. The SSV line is termed a semi-spin valve line because the magnetic layer 122 and nonmagnetic layer 124 may be considered to be analogous to two of the layers (e.g. the pinned/reference layer and nonmagnetic spacer layer) of a spin valve. In some embodiments both the layers 122 and 124 are conductive and, may be metals. In some other embodiments only the layer 124 is conductive, but the layer 122 is an insulator or a conductor with a very high resistivity. In some embodiments, the magnetic layer is at least one nanometer thick and not more than five nanometers thick. The magnetic layer 122 has its magnetic moment polarized in a particular direction. In general, the direction of magnetization for the magnetic layer 122 is desired to be fixed during operation of the memory 100. However, in other embodiments, the direction of the magnetic moment may be switched, for example by the application of a field or a current. The magnetic moment of the magnetic layer 122 may be oriented in-plane, perpendicular to plane, or canted at an angle from the z-axis. The direction of magnetization of the magnetic layer 122 may be selected depending upon the direction of the easy axis of the free layer 112. The magnetic moment of the magnetic layer 122 is generally desired to remain fixed throughout operation of the magnetic memory 100. Materials that may be used for the magnetic layer 122 may include one or more of the following elements Fe, Co, Ni, Pt, Pd, Mn, Y, Cr, Ru, Rh, W, Ta, B, Bi, Ir, Pb, B, N, O; but other materials may also be used. The nonmagnetic layer 124 is between the magnetic layer 122 and the magnetic junction 110. The magnetic layer 124 may include one or more of the following elements Cu, Ag, Au, Ta, W, and N. However, in other embodiments, other nonmagnetic materials may be used. The nonmagnetic layer 124 may be at least 0.4 nanometer and not more than ten nanometers thick. However, in other embodiments, other thicknesses may be used for the layers 122 and/or 124.

In operation, a current is driven through the SSV line 120 in plane. One such current density is shown in FIG. 3 as $J_{SSV}$. The direction of flow of the current ("current direction") for an in-plane current is substantially in the x-y plane, for example parallel or antiparallel to $J_{SSV}$. Because the current is in-plane, the current direction is substantially perpendicular to the direction between the magnetic junction 110 and the SSV line 120. Stated differently, the perpendicular-to-plane direction for the SSV line 120 is substantially perpendicular to the current direction. In order to drive the in-plane current through the SSV line 120, an electric field is generated along the current direction. Although the resulting net displacement of the Fermi surface for the charge carriers is along (parallel or antiparallel, depending upon the sign of their charge) the current (x) direction, the actual movement of charge carriers in the SSV line 120 is in multiple directions. In other words, some charge carriers may have components of velocity in the y-direction and/or the z-direction. Stated differently, although the average velocity of charge carriers, and thus current, is in-plane, the charges may move in all directions. For example, one electron, e⁻, is shown as having a significant component of velocity perpendicular to the current direction.

Because of the in-plane current and the proximity of nonmagnetic and magnetic materials in the SSV line 120, the there is a net flow of spin information in a direction from the magnetic layer 122 to the nonmagnetic layer 124. In other words, there is a net flow of spin information perpendicular-to-plane. The magnetic layer 122 has a magnetic moment (e.g. is ferromagnetic). The charge carriers in the magnetic layer 122 thus tend to be spin polarized. For example, in the embodiment shown, electrons in the magnetic layer 122 tend to have their spins polarized along the direction of the magnetic moment (not shown in FIG. 3). The portion of the current through the SSV line 120 due to the magnetic layer 122 may be spin polarized. The polarization of the spins in the magnetic layer 122 may be set by the polarization of the magnetic layer 122. The spin flow is generally proportional to the density of spin states at the Fermi level for the ferromagnetic layer. Typical ferromagnetic materials may have a spin polarization of approximately 0.4 through 0.8. In contrast, because the layer 124 is nonmagnetic, the charge carriers/electrons in the nonmagnetic layer 124 tend not to have their spins polarized in any direction. Stated differently, the electrons in the nonmagnetic layer 124 have their spins randomly polarized (or "unpolarized"). Consequently, the portion of the current through the SSV line 120 due to the nonmagnetic layer 124 tends to be unpolarized.

As discussed above, although the current travels in the direction of $J_{SSV}$, individual charge carriers may move in other directions. At least some of these charge carriers cross from the magnetic layer 122 to the nonmagnetic layer 124. These charge carriers also carry their spin information with them. Because the charge carriers from the magnetic layer 122 are part of a spin polarized current, there is a flow of spin polarized charge carriers from the magnetic layer 122 to the nonmagnetic layer 124. In contrast, there is no spin polarized flow from the nonmagnetic layer 124 to the magnetic layer 122. The charge carriers from the nonmagnetic layer 124 are unpolarized. Although these charge carriers may cross from the nonmagnetic layer 124 to the magnetic layer 122, the spin information that they carry with them is unpolarized.

In order to determine the net flow of spin information between the layers 122 and 124, the charge carriers moving from the layer 122 to the layer 124 and the charge carriers moving from the layer 124 to the layer 122 are accounted for. As discussed above, there is a spin polarized flow from the layer 122 to the layer 124 and an unpolarized flow from the layer 124 to the layer 122. There is, therefore, a net flow of spin information perpendicular to $J_{SSV}$ (from the magnetic layer 122 to the nonmagnetic layer 124). This spin information is polarized in the direction of polarization of the current from the magnetic layer 122 to the nonmagnetic layer 124. Thus, there is a flow of spin information having a polarization that matches the magnetic moment of the magnetic layer 122 toward the nonmagnetic layer 124. The characteristic length that a charge carrier flows unimpeded in a metal is the mean free path (MFP). If the nonmagnetic layer 124 has a thickness of less than the MFP of a current carrier in the material for the nonmagnetic layer 124, then the flow of spin information may travel substantially unimpeded through the nonmagnetic layer. Thus, there is a flow of spin information corresponding to the direction of magnetization of the layer 122 in the perpendicular-to-plane direction. Thus, an in-plane current flowing through the SSV line 120 results in a transfer of spin polarized information perpendicular to the current direction. Note that regardless of the current direction (parallel or antiparallel to the direction of $J_{SSV}$), the polarization of the net flow of spin information to the nonmagnetic layer 124 is parallel to the direction of magnetization for the magnetic layer 122. If little or no spin polarized current flows through the magnetic junction 110, then there may be an accumulation of spin polarized charge carriers within the nonmagnetic layer 124 in the vicinity of the magnetic junction 110. The accumulation of spin polarized charge carriers may exert a torque ("spin accumulation induced torque") on the magnetic junction 110 analogous to the torque exerted by SO based switching.

Mechanisms other than the proximity effect described above may contribute to spin accumulation in the non-magnetic layer 124 in addition to or in lieu of those described above. For instance, the so-called anomalous Hall effect (also called the extraordinary Hall effect) in the magnetic layer 122 may also result in the spin accumulation in the non-magnetic layer 124. As described above, in some embodiments that magnetic layer 122 has resistance much larger than the nonmagnetic layer 124, particularly, when the magnetic layer 122 is an insulating layer, like yttrium iron garnet (YIG), magnetic oxide or other highly resistive layer. For those embodiments, the in-plane current $J_{ssv}$ flows primarily in the nonmagnetic layer 124. Spin-dependent scattering of the conduction electrons from the interface with the magnetic layer 122 may result in the development of the spin accumulation in the non-magnetic layer 124. The direction of this spin accumulation may be along the direction of magnetization of the magnetic layer 122 or opposite to it. But for some embodiments this direction may be at some angle to the magnetization of the magnetic layer 122. Spin-dependent scattering from the interface between the non-magnetic layer 124 and the magnetic layer 122 may also considerably contribute to the spin accumulation in the non-magnetic layer 122 in the embodiments, in which the resistivity of the magnetic layer 122 is comparable to the resistance of the non-magnetic layer 124. Note that for those mechanisms, the sign of the polarization of the net flow of spin information to the nonmagnetic layer 124 changes when the current direction is reversed.

The free layer 112 of the magnetic junction may be switched, or written, using the spin accumulation induced torque. As discussed above, charge carriers having their spins polarized in the direction of the magnetic moment of the magnetic layer 122 may accumulate near the magnetic junction 110 when an in-plane current (e.g. having density $J_{SSV}$) is driven through the SSV line 120. This is particularly true if the current perpendicular-to-plane (e.g. along the z-axis) through the magnetic junction 110 is small or zero. Using a magnetic junction 110 having a higher resistance than the SSV line 120 and/or deselecting the magnetic junction 110 may aid in ensuring that spin polarized charge carriers accumulate near the magnetic junction 110. These accumulated spin polarized charge carriers may induce a torque on the free layer 112 due to their spin polarization. In particular, the spin accumulation induced torque may perturb the magnetic moment of the free layer 112 away from the easy axis. The magnetic moment of the free layer 112 may thus be tilted away from the stagnation point for spin transfer torque (STT) switching.

To complete switching/writing of the free layer 112, a perpendicular-to-plane (CPP) current may be driven through the magnetic junction 110. The spin accumulation based torque has been generated and has tilted the magnetic moment of the free layer 112 from the stagnation point as discussed above. A CPP current may then be driven through the magnetic junction 110 to exert an STT torque on the magnetic moment of the free layer 112. The free layer 112 magnetic moment may then be switched using the STT torque. Because the spin accumulation induced torque has tilted the free layer magnetic moment from the stagnation point/easy axis, the STT based switching may proceed more quickly. Thus, the magnetic junction 110 may more rapidly undergo STT-based switching. In other embodiments, the spin polarization of the spin accumulation in the non-magnetic layer 124 may be along the easy axis of the free layer 112. For some of these embodiments, the magnetic moment of the magnetic layer 122 is directed along the easy axis of the free layer 112. The free layer 112 magnetic moment may then be switched using the torque induced by the spin accumulation. For some of these embodiments, FL may be switched by this torque even if no other torque acts on the FL (e.g. if the CPP current is zero or very small). This more rapid switching may be undertaken using well known materials for the magnetic layer 122 and nonmagnetic layer 120 of the SSV line 120. For example, knowledge of spin valves may be used in achieving the desired interface between the magnetic layer 122 and the nonmagnetic layer 124. The magnetic anisotropy and other properties of the magnetic layer 122 may also be configured to achieve the desired direction (e.g. in-plane or perpendicular to plane) magnetic moment direction. In addition, because the current corresponding to $J_{SSV}$ is in-plane, a larger current may be used. A larger spin accumulation based torque may thus be generated. Switching of the magnetic junction 110 may thus be facilitated.

In contrast, for a read operation, the magnetic junction 110 may operate in a manner analogous to other STT memories. For example, a read current may be driven in the direction of $J_{STT}$. However, the magnitude of the read current may be less than the write current used for a write operation. The resistance of the magnetic junction 110 may be used to determine whether the magnetic junction 110 is in a higher resistance state or a lower resistance state.

Figure 4:
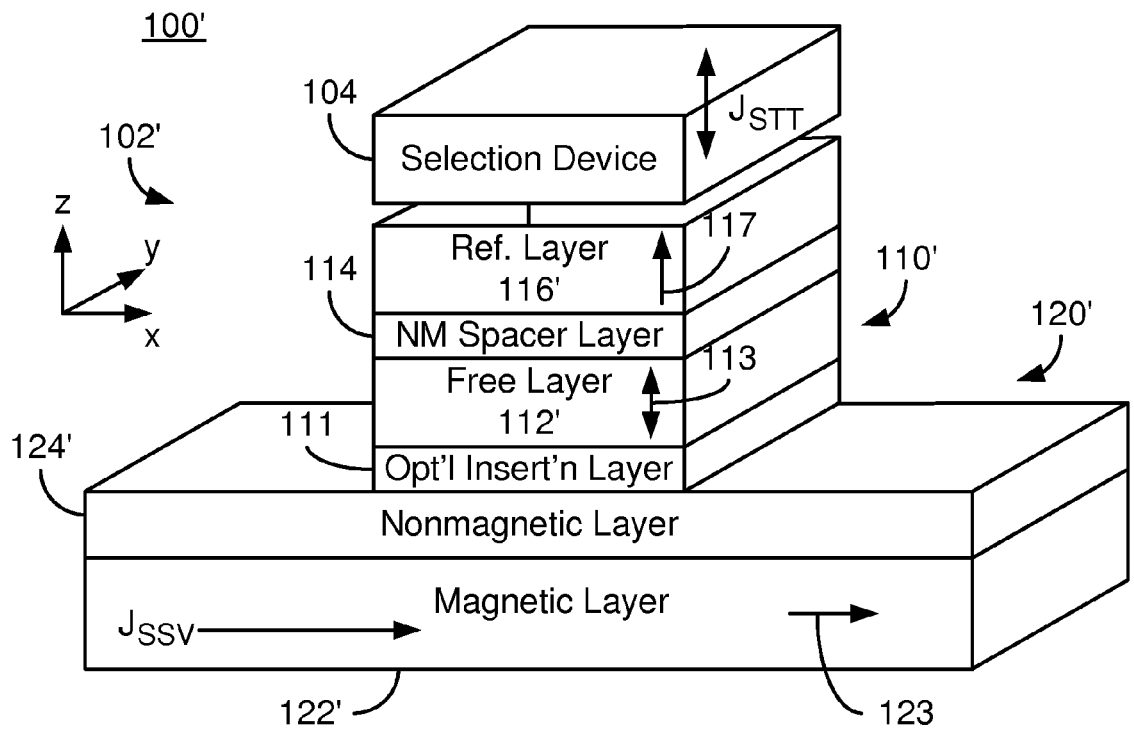
FIG. 4 depicts an exemplary embodiment of a portion of a magnetic memory that includes a dual magnetic junction switched using spin-orbit interaction.

FIG. 4 depicts a perspective view of another exemplary embodiment of a portion of a magnetic memory 100' that includes magnetic junction 110' switched using accumulated charge carriers. The magnetic memory 100' may be used in devices that utilize RAM, particularly MRAM, including but not limited to cellular phones, other mobile devices and computing devices. For clarity, FIG. 4 is not to scale. In addition, portions of the magnetic memory 100' such as bit lines, word lines, row selectors and column selectors are not shown or not labeled as such. The magnetic memory 100' is analogous to the magnetic memory 100. The magnetic memory 100' thus includes a magnetic storage cell 102' and an SSV line 120' analogous to the magnetic storage cell 102 and SSV line 120, respectively. The magnetic storage cell 102' includes a magnetic junction 110' and a selection device 104 analogous to the components 102 and 110, respectively. In some embodiments, the magnetic storage cell 102' may have additional components including but not limited to another magnetic junction and one or more additional selection devices. The magnetic storage cell may be one of a number of magnetic storage cells ordered in an array. Similarly, multiple SSV lines 120' may be used in the magnetic memory 100'.

The magnetic junction 110' includes an optional insertion layer 111, a free layer 112', a nonmagnetic spacer layer 114 and a reference layer 116' analogous to optional insertion layer 111, the free layer 112, nonmagnetic spacer layer 114 and reference layer 116, respectively. The magnetic moments 113 and 117 of the free layer 112' and reference layer 116', respectively, are also shown. The free layer magnetic moment 113 is perpendicular-to-plane. In some embodiments, the free layer magnetic moment 113 is switchable using a combination of accumulated spin torque and STT based switching. In other embodiments, discussed below, the free layer magnetic moment 113 may be switchable using accumulated spin torque without the use of STT based switching. Because the magnetic moment 113 of the free layer 112' is switchable, it is depicted as a dual headed arrow. In addition, the easy axis of the free layer 112' is in the same direction as the magnetic moment 113.

The SSV line 120' includes a magnetic layer 122' and a nonmagnetic layer 124' that are analogous to the magnetic layer 122 and the nonmagnetic layer 124, respectively. In addition, the magnetic moment 123 of the magnetic layer 122' for some embodiments is shown. In the embodiment shown, the magnetic moment 123 is substantially perpendicular to the magnetic moment 113 of the free layer 112' but is in-plane. In other embodiments, other angles are possible. For example, in some embodiments, the magnetic moment 123 may be perpendicular to plane. The magnetic moment of the magnetic layer 122' is generally desired to remain fixed throughout operation of the magnetic memory 100'. Materials that may be used for the magnetic layer 122' may include one or more of the following elements Fe, Co, Ni, Pt, Pd, Mn, Y, Cr, Ru, Rh, W, Ta, B, Bi, Ir, Pb, B, N, O; but other materials may also be used. The nonmagnetic layer 124' is between the magnetic layer 122' and the magnetic junction 110'. The magnetic layer 124' may include one or more of the following elements Cu, Ag, Au, Ta, W, and N. However, in other embodiments, other nonmagnetic materials may be used.

For a write operation, an in-plane current, for example corresponding to $J_{SSV}$, is driven through the SSV line 120'. In some embodiments, current may be prevented from flowing through the magnetic junction 110' for at least a portion of the time that the in-plane current flows through the SSV line 120'. Using a magnetic junction 110' having a higher resistance than the SSV line 120' and/or deselecting the magnetic junction 110' may aid in preventing current from flowing through the magnetic junction 110' and allowing spin polarized charge carriers to accumulate near the magnetic junction 110'. Spins polarized in the x direction (parallel to the magnetic moment 123) accumulate in the nonmagnetic layer 124' near the magnetic junction 110'. The torque from these accumulated spins tilts the magnetic moment 113 in the direction of the magnetic moment 123 of the magnetic layer 122'. Thus, the magnetic moment 113 of the free layer 112' may be tilted away from the stagnation point for STT switching. To complete switching of the free layer 112', a CPP current, $J_{STT}$, may be driven through the magnetic junction 110'. The CPP current exerts an STT torque on the magnetic moment of the free layer 112'. The free layer 112' magnetic moment 113 may thus be switched using the STT torque. For a read operation, a read current may be driven through the magnetic junction 110' in the direction of $J_{STT}$. The resistance of the magnetic junction 110' may be used to determine whether the magnetic junction 110' is in a high resistance state or a low resistance state.

In some embodiments, the free layer 112' magnetic moment may be switched using the SO current driven through the SSV line. In such embodiments, the magnetic moment 123 of the layer 122' is desired to be along the easy axis of the free layer 112'. For a write operation in such embodiments, an in-plane current, for example corresponding to $J_{SSV}$, is driven through the SSV line 120'. In some embodiments, current may be prevented from flowing through the magnetic junction 110' for at least a portion of the time that the in-plane current flows through the SSV line 120'. Using a magnetic junction 110' having a higher resistance than the SSV line 120' and/or deselecting the magnetic junction 110' may aid in preventing current from flowing through the magnetic junction 110' and allowing spin polarized charge carriers to accumulate near the magnetic junction 110'. Spins polarized in the x direction (parallel to the magnetic moment 123) accumulate in the nonmagnetic layer 124' near the magnetic junction 110'. In some embodiments, the direction of the spins accumulated near the nonmagnetic layer 124' depends upon the direction in which the current $J_{SSV}$ flows in the magnetic layer 122'. The torque from these accumulated spins may switch the magnetic moment 113 in the direction of the magnetic moment 123 of the magnetic layer 122'.

Thus, the benefits of the magnetic junction 110 may be achieved for the magnetic junction 110' having a free layer magnetic moment 113 perpendicular-to-plane. Because the spin accumulation induced torque has tilted the free layer magnetic moment 113 from the stagnation point/easy axis, the STT based switching may be faster. Thus, the magnetic junction 110' may more rapidly undergo STT-based switching. This more rapid switching may be undertaken using well known materials for the magnetic layer 122' and nonmagnetic layer 120' of the SSV line 120'. In addition, because the current corresponding to $J_{SSV}$ is in-plane, a larger current may be used. A larger spin accumulation based torque may thus be generated. Switching of the magnetic junction 110' may thus be facilitated.

Figure 5:
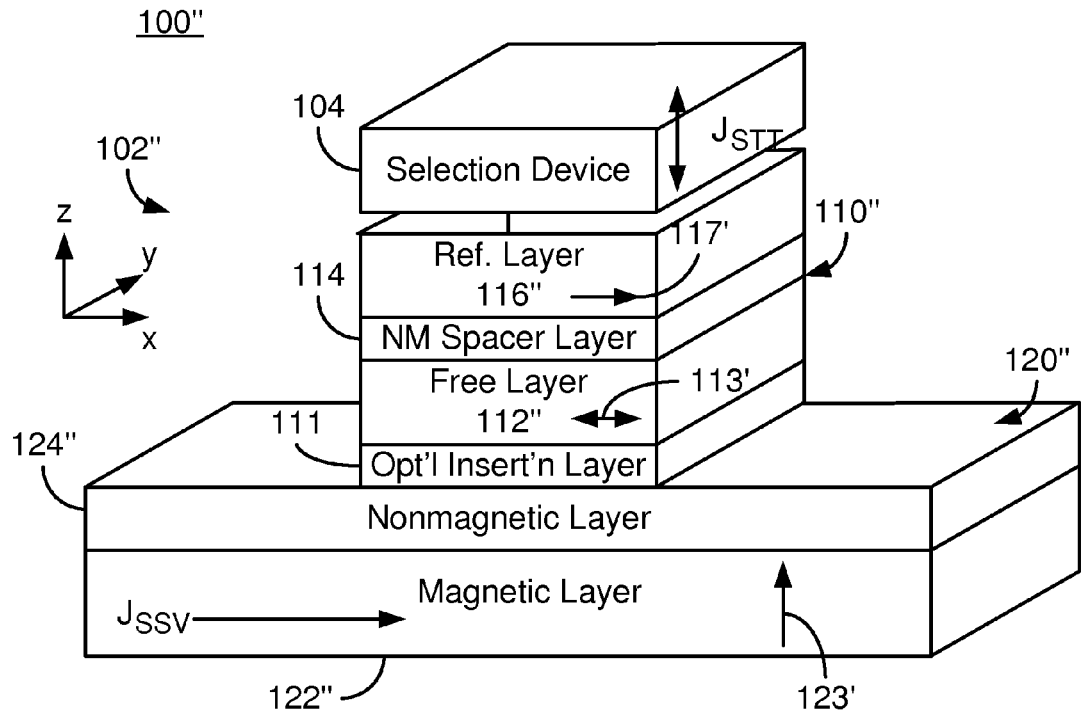
FIG. 5 depicts another exemplary embodiment of a portion of a magnetic memory that includes a dual magnetic junction switched using spin-orbit interaction in switching.

FIG. 5 depicts a perspective view of another exemplary embodiment of a portion of a magnetic memory 100" that includes magnetic junction 110" switched using accumulated charge carriers. The magnetic memory 100" may be used in devices that utilize RAM, particularly MRAM, including but not limited to cellular phones, other mobile devices and computing devices. For clarity, FIG. 5 is not to scale. In addition, portions of the magnetic memory 100" such as bit lines, word lines, row selectors and column selectors are not shown or not labeled as such. The magnetic memory 100" is analogous to the magnetic memory 100. The magnetic memory 100" thus includes a magnetic storage cell 102" and an SSV line 120" analogous to the magnetic storage cell 102 and SSV line 120, respectively. The magnetic storage cell 102" includes a magnetic junction 110" and a selection device 104 analogous to the components 102 and 110, respectively. In some embodiments, the magnetic storage cell 102" may have additional components including but not limited to another magnetic junction and one or more additional selection devices. The magnetic storage cell may be one of a number of magnetic storage cells ordered in an array. Similarly, multiple SSV lines 120" may be used in the magnetic memory 100".

The magnetic junction 110" includes an optional insertion layer 111, a free layer 112", a nonmagnetic spacer layer 114 and a reference layer 116" analogous to optional insertion layer 111, the free layer 112, nonmagnetic spacer layer 114 and reference layer 116, respectively. The magnetic moments 113' and 117' of the free layer 112" and reference layer 116", respectively, are also shown. The free layer magnetic moment 113' is in-plane in the embodiment shown. The free layer magnetic moment 113' is switchable using a combination of accumulated spin torque and STT based switching in the embodiment shown. In other embodiments, in which the magnetic layer 122" has an in-plane magnetic moment 123', the free layer magnetic moment 113' may be switchable using accumulated spin torque alone. Because the magnetic moment 113" of the free layer 112" is switchable, it is depicted as a dual headed arrow. In addition, the easy axis of the free layer 112" is in the same direction as the magnetic moment 113'.

The SSV line 120" includes a magnetic layer 122" and a nonmagnetic layer 124" that are analogous to the magnetic layer 122 and the nonmagnetic layer 124, respectively. In addition, the magnetic moment 123' of the magnetic layer 122" is shown. The magnetic moment 123' is substantially perpendicular to the magnetic moment 113' of the free layer 112" and substantially perpendicular to plane. In other embodiments, other angles are possible. The magnetic moment of the magnetic layer 122" is generally desired to remain fixed throughout operation of the magnetic memory 100'. Materials that may be used for the magnetic layer 122" may include one or more of the following elements Fe, Co, Ni, Pt, Pd, Mn, Y, Cr, Ru, Rh, W, Ta, B, Bi, Ir, Pb, B, N, O; but other materials may also be used. The nonmagnetic layer 124" is between the magnetic layer 122" and the magnetic junction 110". The magnetic layer 124" may include one or more of the following elements Cu, Ag, Au, Ta, W, and N. However, in other embodiments, other nonmagnetic materials may be used.

For a write operation, an in-plane current, for example corresponding to $J_{SSV}$, is driven through the SSV line 120". In some embodiments, current may be prevented from flowing through the magnetic junction 110" for at least a portion of the time that the in-plane current flows through the SSV line 120". Using a magnetic junction 110" having a higher resistance than the SSV line 120" and/or deselecting the magnetic junction 110" may aid in preventing current from flowing through the magnetic junction 110" and allowing spin polarized charge carriers to accumulate near the magnetic junction 110". Spins polarized perpendicular-to-plane (parallel to the magnetic moment 123') accumulate in the nonmagnetic layer 124" near the magnetic junction 110". The torque from these accumulated spins tilts the magnetic moment 113' in the direction from the magnetic layer 122". The magnetic moment 113' of the free layer 112" may thus be tilted away from the stagnation point for STT switching. To complete switching of the free layer 112", a CPP current, $J_{STT}$, may be driven through the magnetic junction 110". The CPP current exerts an STT torque on the magnetic moment of the free layer 112". The free layer 112" magnetic moment 113' may thus be switched using the STT torque. Alternatively, as discussed above with respect to FIG. 4, the in-plane current through the magnetic layer 122" may be used to switch the magnetic moment 113' of the free layer 112" if the magnetic moment 123' is also in plane and along the easy axis of the free layer 112". In such embodiments, a change in the direction of $J_{SSV}$ may change the direction of torque from the accumulated spins. Therefore, the magnetic moment 113' of the free layer 112" may be switched between stable states. For a read operation, a read current may be driven through the magnetic junction 110" in the direction of $J_{STT}$. The resistance of the magnetic junction 110" may be used to determine whether the magnetic junction 110" is in a high resistance state or a low resistance state.

Thus, the benefits of the magnetic junction 110 may be achieved for the magnetic junction 110" having a free layer magnetic moment 113' in-plane. Because the spin accumulation induced torque has tilted the free layer magnetic moment 113' from the stagnation point/easy axis, the STT based switching may be faster. Thus, the magnetic junction 110" may more rapidly undergo STT-based switching. Alternatively, spin accumulation may be used to switch the magnetic moment 113'. This more rapid switching may be undertaken using well known materials for the magnetic layer 122" and nonmagnetic layer 120" of the SSV line 120". In addition, because the current corresponding to $J_{SSV}$ is in-plane, a larger current may be used. A larger spin accumulation based torque may thus be generated. Switching of the magnetic junction 110" may thus be facilitated.

Figure 6:
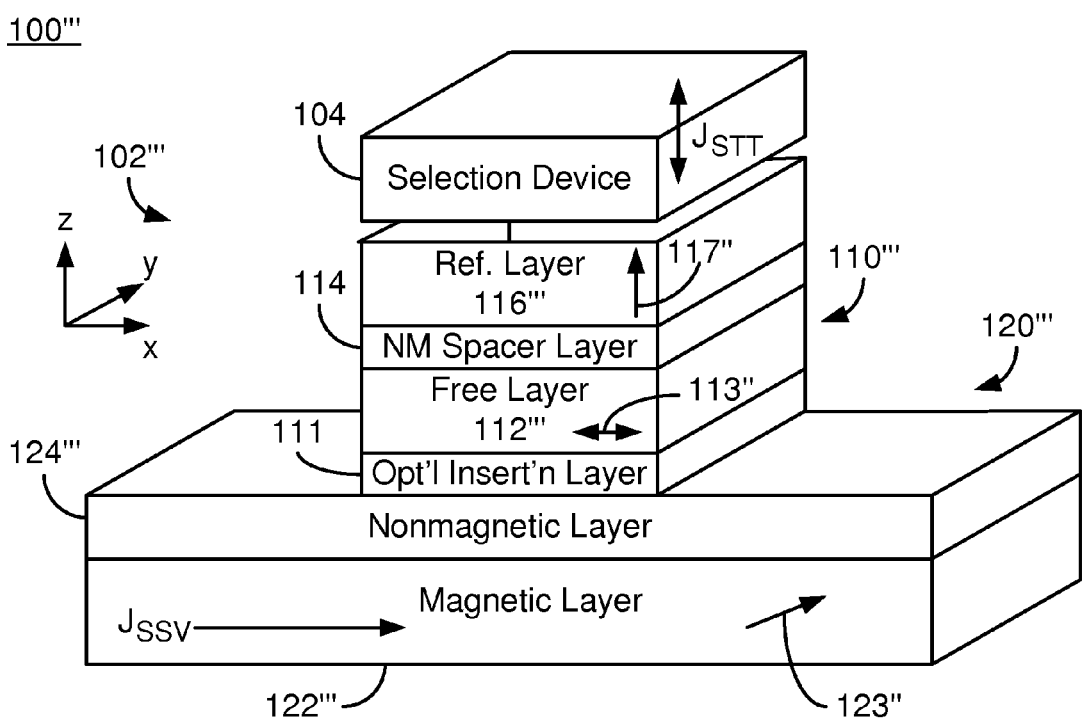
FIG. 6 depict another exemplary embodiment of a portion of a magnetic memory that includes a dual magnetic junction switched using spin-orbit interaction in switching

FIG. 6 depicts a perspective view of another exemplary embodiment of a portion of a magnetic memory 100''' that includes magnetic junction 110''' switched using accumulated charge carriers. The magnetic memory 100" may be used in devices that utilize RAM, particularly MRAM, including but not limited to cellular phones, other mobile devices and computing devices. For clarity, FIG. 6 is not to scale. In addition, portions of the magnetic memory 100''' such as bit lines, word lines, row selectors and column selectors are not shown or not labeled as such. The magnetic memory 100''' is analogous to the magnetic memory 100. The magnetic memory 100''' thus includes a magnetic storage cell 102''' and an SSV line 120''' analogous to the magnetic storage cell 102 and SSV line 120, respectively. The magnetic storage cell 102'''' includes a magnetic junction 110''' and a selection device 104 analogous to the components 102 and 110, respectively. In some embodiments, the magnetic storage cell 102''' may have additional components including but not limited to another magnetic junction and one or more additional selection devices. The magnetic storage cell may be one of a number of magnetic storage cells ordered in an array. Similarly, multiple SSV lines 120''' may be used in the magnetic memory 100'''.

The magnetic junction 110''' includes an optional insertion layer 111, a free layer 112'''', a nonmagnetic spacer layer 114 and a reference layer 116''' analogous to optional insertion layer 111, the free layer 112, nonmagnetic spacer layer 114 and reference layer 116, respectively. The magnetic moments 113" and 117" of the free layer 112''' and reference layer 116''', respectively, are also shown. The free layer magnetic moment 113" is in-plane but is angled from the current direction. The free layer magnetic moment 113" is also and switchable using a combination of accumulated spin torque and STT based switching in the embodiment shown. In embodiments in which the magnetic moment 123" is along the easy axis of the free layer 112''', spin accumulation may be used in the absence of STT based switching. For example, if the magnetic moments 113" and 123" are both canted from the current direction, spin accumulation may be used to switch the magnetic moment 113". Because the magnetic moment 113" of the free layer 112" is switchable, it is depicted as a dual headed arrow. In addition, the easy axis of the free layer 112''' is in the same direction as the magnetic moment 113".

The SSV line 120''' includes a magnetic layer 122''' and a nonmagnetic layer 124''' that are analogous to the magnetic layer 122 and the nonmagnetic layer 124, respectively. In addition, the magnetic moment 123" of the magnetic layer 122''' is shown. The magnetic moment 123" is substantially perpendicular to the magnetic moment 113" of the free layer 112''' but is still in-plane. In other embodiments, other angles are possible. For example, the magnetic moments 123" and 113" may be in-plane and canted from the current direction. The magnetic moment of the magnetic layer 122''' is generally desired to remain fixed throughout operation of the magnetic memory 100'''. Materials that may be used for the magnetic layer 122''' may include one or more of the following elements Fe, Co, Ni, Pt, Pd, Mn, Y, Cr, Ru, Rh, W, Ta, B, Bi, Ir, Pb, B, N, O; but other materials may also be used. The nonmagnetic layer 124''' is between the magnetic layer 122''' and the magnetic junction 110'''. The magnetic layer 124''' may include one or more of the following elements Cu, Ag, Au, Ta, W, N. However, in other embodiments, other nonmagnetic materials may be used.

The memory 100''' operates in an analogous manner to the magnetic memory 100. During a write operation, charge carriers having their spins aligned with the magnetic moment 123" accumulate near the magnetic junction 110''' The torque from these accumulated spins tilts the magnetic moment 113" away from the stagnation point for STT switching. To complete switching of the free layer 112", the CPP current $J_{STT}$ may be driven through the magnetic junction 110'''. The CPP current exerts an STT torque on the magnetic moment of the free layer 112'''. The magnetic moment 113" may thus be switched using the STT torque. Alternatively, as discussed above with respect to FIGS. 4 and 5, the in-plane current through the magnetic layer 122''' may be used to switch the magnetic moment 113" of the free layer 112''' if the magnetic moment 123" is also in plane and along the easy axis of the free layer 112'''. In such embodiments, a change in the direction of $J_{SSV}$ may change the direction of torque from the accumulated spins. Therefore, the magnetic moment 113" of the free layer 112''' may be switched between stable states. For a read operation, a read current may be driven through the magnetic junction 110''' in the direction of $J_{STT}$. The resistance of the magnetic junction 110''' may be used to determine whether the magnetic junction 110''' is in a high resistance state or a low resistance state.

Thus, the benefits of the magnetic junction 110 may be achieved for the magnetic junction 110''' having a free layer magnetic moment 113" in-plane. Because the spin accumulation induced torque has tilted the free layer magnetic moment 113" from the stagnation point/easy axis, the STT based switching may be faster. Thus, the magnetic junction 110''' may more rapidly undergo STT-based switching. In other embodiments, spin accumulation may be used to switch the free layer magnetic moment 113" in the absence of STT based switching. This more rapid switching may be undertaken using well known materials for the magnetic layer 122''' and nonmagnetic layer 120''' of the SSV line 120'''. In addition, because the current corresponding to $J_{SSV}$ is in-plane, a larger current may be used. A larger spin accumulation based torque may thus be generated. Switching of the magnetic junction 110''' may thus be facilitated.

Figure 7:
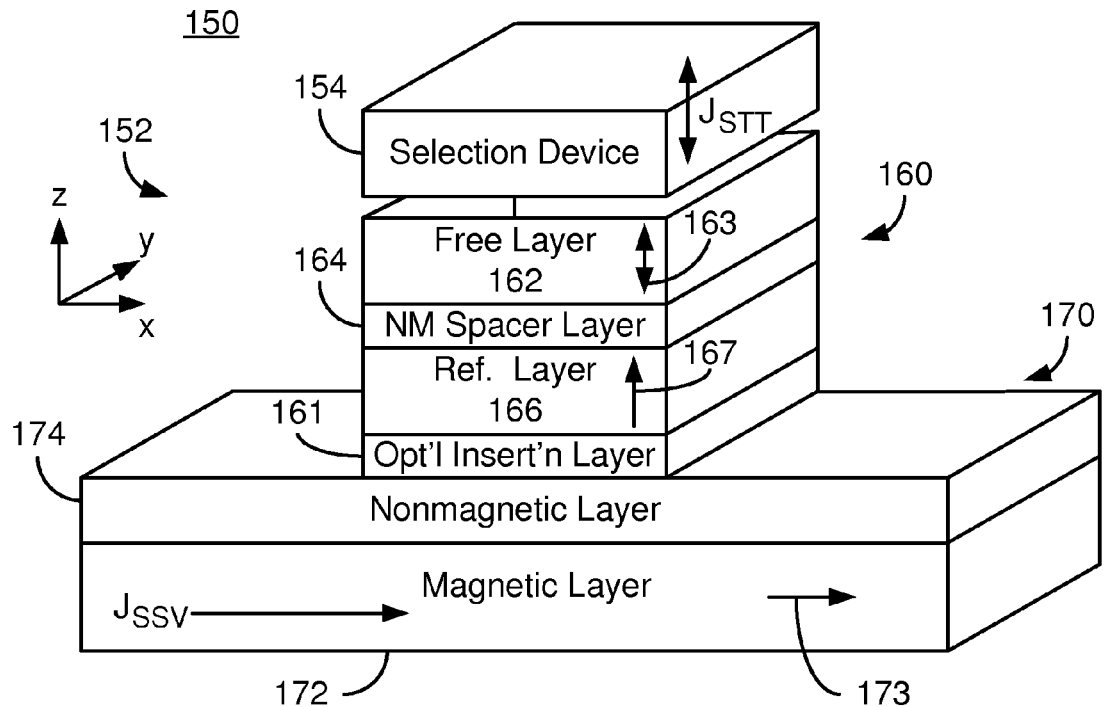
FIG. 7 depicts another exemplary embodiment of a portion of a magnetic memory that includes a dual magnetic junction switched using spin-orbit interaction in switching.

FIG. 7 depicts a perspective view of another exemplary embodiment of a portion of a magnetic memory 150 that includes magnetic junction 160 switched using accumulated charge carriers. The magnetic memory 150 may be used in devices that utilize RAM, particularly MRAM, including but not limited to cellular phones, other mobile devices and computing devices. For clarity, FIG. 7 is not to scale. In addition, portions of the magnetic memory 150 such as bit lines, word lines, row selectors and column selectors are not shown or not labeled as such. The magnetic memory 150 is analogous to the magnetic memory 100. The magnetic memory 150 thus includes a magnetic storage cell 152 and an SSV line 170 analogous to the magnetic storage cell 102 and SSV line 120, respectively. The magnetic storage cell 152 includes a magnetic junction 160 and a selection device 154 analogous to the components 102 and 110, respectively. In some embodiments, the magnetic storage cell 152 may have additional components including but not limited to another magnetic junction and one or more additional selection devices. The magnetic storage cell may be one of a number of magnetic storage cells ordered in an array. Similarly, multiple SSV lines 170 may be used in the magnetic memory 150.

The magnetic junction 160 includes an optional insertion layer 161, a free layer 162, a nonmagnetic spacer layer 164 and a reference layer 166 analogous to optional insertion layer 111, the free layer 112, nonmagnetic spacer layer 114 and reference layer 116, respectively. Although depicted as a single magnetic junction, the magnetic junction 160 may be a dual magnetic junction including an additional nonmagnetic spacer layer and an additional reference layer. In such embodiments, the free layer is between the two nonmagnetic spacer layers. Further, the additional nonmagnetic spacer layer is between the free layer and the additional reference layer. The magnetic moments 163 and 167 of the free layer 162 and reference layer 166, respectively, are also shown. The free layer magnetic moment 163 is perpendicular-to-plane and switchable using a combination of accumulated spin torque and STT based switching. Because the magnetic moment 163 of the free layer 162 is switchable, it is depicted as a dual headed arrow. In addition, the easy axis of the free layer 162 is in the same direction as the magnetic moment 163. However, it is noted that the arrangement of the layers of the magnetic junction 160 with respect to the SSV line 170 differs from that of the magnetic junctions 110, 110', 110" and 110'". In the magnetic junction 160, the reference layer 166 is between the free layer 162 and the SSV line 170. In embodiments in which the optional insertion layer 161 is omitted, the reference layer 166 may adjoin the SSV line 170.

The SSV line 170 includes a magnetic layer 172 and a nonmagnetic layer 174 that are analogous to the magnetic layer 122 and the nonmagnetic layer 124, respectively. In addition, the magnetic moment 173 of the magnetic layer 172 is shown. The magnetic moment 173 is substantially perpendicular to the magnetic moment 167 of the reference layer 166. Thus, the magnetic moment 173 is in plane, while the reference layer magnetic moment 167 is perpendicular to plane. The magnetic moment 173 is also substantially perpendicular to the magnetic moment 163 of the free layer 162. In other embodiments, other angles are possible. However, the magnetic moment 173 is desired to be angled from the magnetic moment 167 of the reference layer 166. The magnetic moment of the magnetic layer 172 is generally desired to remain fixed throughout operation of the magnetic memory 150. Materials that may be used for the magnetic layer 152 may include one or more of the following elements Fe, Co, Ni, Pt, Pd, Mn, Y, Cr, Ru, Rh, W, Ta, B, Bi, Ir, Pb, B, N, O; but other materials may also be used. The nonmagnetic layer 174 is between the magnetic layer 172 and the magnetic junction 160. The magnetic layer 174 may include one or more of the following elements Cu, Ag, Au, Ta, W, and N. However, in other embodiments, other nonmagnetic materials may be used.

For a write operation, an in-plane current, for example corresponding to $J_{SSV}$, is driven through the SSV line 170. In some embodiments, current may be prevented from flowing through the magnetic junction 160 for at least a portion of the time that the in-plane current flows through the SSV line 170. Using a magnetic junction 160 having a higher resistance than the SSV line 170 and/or deselecting the magnetic junction 160 may aid in preventing current from flowing through the magnetic junction 160 and allowing spin polarized charge carriers to accumulate near the magnetic junction 160. Spins polarized in the x direction (parallel to the magnetic moment 173) accumulate in the nonmagnetic layer 174 near the magnetic junction 160. The torque from these accumulated spins tilts the magnetic moment 167 of the reference layer 166 in the direction of the magnetic moment 173 of the magnetic layer 172. This tilt can occur even though the magnetic moment 167 of the reference layer 160 is normally fixed, or pinned, in place. However, the magnetic moment 167 of the reference layer 166 does not switch directions. Instead, the magnetic moment 167 is perturbed by the spin accumulation induced torque, but returns to the initial position after the spin accumulation induced torque is removed. The perturbation in the magnetic moment 167 of the reference layer 166 then perturbs the magnetic moment 163 of the free layer 162. The magnetic moment 163 of the free layer 162 may thus be tilted away from the stagnation point for STT switching. To complete switching of the free layer 162, a CPP current, $J_{STT}$, may be driven through the magnetic junction 160. The CPP current exerts an STT torque on the magnetic moment 163 of the free layer 162. The free layer 162 magnetic moment 163 may be switched using the STT torque and torque from accumulated spins. The write operation may thus be completed. For a read operation, a read current may be driven through the magnetic junction 160 in the direction of $J_{STT}$. The resistance of the magnetic junction 160 may be used to determine whether the magnetic junction 160 is in a high resistance state or a low resistance state.

Thus, the benefits of the magnetic junction 110 may be achieved for the magnetic junction 160 having a free layer magnetic moment 163 perpendicular-to-plane. The spin accumulation induced torque has perturbed the reference layer magnetic moment 167 and, therefore, the tilted free layer magnetic moment 163 from the stagnation point/easy axis. Consequently, the STT based switching may be faster. This more rapid switching may be undertaken using well known materials for the magnetic layer 172 and nonmagnetic layer 174 of the SSV line 170. In addition, because the current corresponding to $J_{SSV}$ is in-plane, a larger current may be used. A larger spin accumulation based torque may thus be generated. Switching of the magnetic junction 160 may thus be facilitated.

Figure 8:
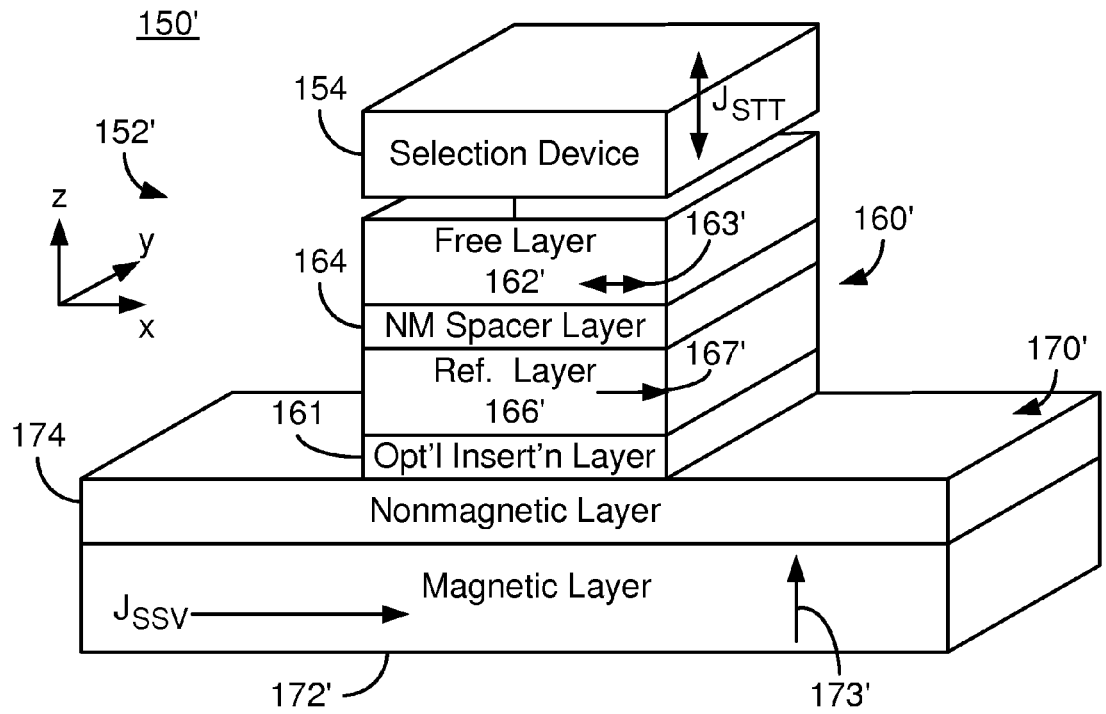
FIG. 8 depicts another exemplary embodiment of a portion of a magnetic memory that includes a dual magnetic junction switched using spin-orbit interaction in switching

FIG. 8 depicts a perspective view of another exemplary embodiment of a portion of a magnetic memory 150' that includes magnetic junction 160' switched using accumulated charge carriers. The magnetic memory 150' may be used in devices that utilize RAM, particularly MRAM, including but not limited to cellular phones, other mobile devices and computing devices. For clarity, FIG. 8 is not to scale. In addition, portions of the magnetic memory 150' such as bit lines, word lines, row selectors and column selectors are not shown or not labeled as such. The magnetic memory 150' is analogous to the magnetic memory 150. The magnetic memory 150' thus includes a magnetic storage cell 152' and an SSV line 170' analogous to the magnetic storage cell 152 and SSV line 170, respectively. The magnetic storage cell 152' includes a magnetic junction 160' and a selection device 154 analogous to the components 152 and 160, respectively. In some embodiments, the magnetic storage cell 152' may have additional components including but not limited to another magnetic junction and one or more additional selection devices. The magnetic storage cell may be one of a number of magnetic storage cells ordered in an array. Similarly, multiple SSV lines 170' may be used in the magnetic memory 150'.

The magnetic junction 160' includes an optional insertion layer 161, a free layer 162', a nonmagnetic spacer layer 164 and a reference layer 166' analogous to optional insertion layer 151, the free layer 162, nonmagnetic spacer layer 164 and reference layer 166, respectively. Although depicted as a single magnetic junction, the magnetic junction 160' may be a dual magnetic junction including an additional nonmagnetic spacer layer and an additional reference layer. In such embodiments, the free layer is between the two nonmagnetic spacer layers. Further, the additional nonmagnetic spacer layer is between the free layer and the additional reference layer. The magnetic moments 163' and 167' of the free layer 162' and reference layer 166', respectively, are also shown. The free layer magnetic moment 163' is in-plane and along the current direction and switchable using a combination of accumulated spin torque and STT based switching. Because the magnetic moment 163' of the free layer 162 is switchable, it is depicted as a dual headed arrow. In addition, the easy axis of the free layer 162' is aligned with the magnetic moment 163'. The reference layer magnetic moment 167' is also in-plane and along the current direction. In the magnetic junction 160', the reference layer 166' is between the free layer 162' and the SSV line 170'. In embodiments in which the optional insertion layer 161' is omitted, the reference layer 166' may adjoin the SSV line 170'.

The SSV line 170' includes a magnetic layer 172' and a nonmagnetic layer 174' that are analogous to the magnetic layer 172 and the nonmagnetic layer 174, respectively. In addition, the magnetic moment 173' of the magnetic layer 172' is shown. The magnetic moment 173' is substantially perpendicular to the magnetic moment 167' of the reference layer 166'. Thus, the magnetic moment 173' is perpendicular-to-plane. The magnetic moment 173' is also substantially perpendicular to the magnetic moment 163' of the free layer 162'. In other embodiments, other angles are possible. However, the magnetic moment 173' is desired to be angled from the magnetic moment 167' of the reference layer 166'. The magnetic moment of the magnetic layer 172' is generally desired to remain fixed throughout operation of the magnetic memory 150'. Materials that may be used for the magnetic layer 152' may include one or more of the following elements Fe, Co, Ni, Pt, Pd, Mn, Y, Cr, Ru, Rh, W, Ta, B, Bi, Ir, Pb, B, N, O; but other materials may also be used. The nonmagnetic layer 174' is between the magnetic layer 172' and the magnetic junction 160'. The magnetic layer 174' may include one or more of the following elements Cu, Ag, Au, Ta, W, and N. However, in other embodiments, other nonmagnetic materials may be used.

The magnetic memory 150' functions in an analogous manner to the magnetic memory 150. For a write operation, an in-plane current, for example corresponding to $J_{SSV}$, is driven through the SSV line 170'. In some embodiments, current may be prevented from flowing through the magnetic junction 160' for at least a portion of the time that the in-plane current flows through the SSV line 170'. Using a magnetic junction 160' having a higher resistance than the SSV line 170' and/or deselecting the magnetic junction 160' may aid in preventing current from flowing through the magnetic junction 160' and allowing spin polarized charge carriers to accumulate near the magnetic junction 160'. Charge carriers that are spin polarized in the perpendicular-to-plane direction (parallel to the magnetic moment 173') accumulate in the nonmagnetic layer 174' near the magnetic junction 160'. The torque from these accumulated spins tilts the magnetic moment 167' of the reference layer 166' in the direction of the magnetic moment 173' of the magnetic layer 172' while the torque is induced on the magnetic moment 167'. The perturbation in the magnetic moment 167' of the reference layer 166' then perturbs the magnetic moment 163' of the free layer 162'. The magnetic moment 163' of the free layer 162' may thus be tilted away from the stagnation point for STT switching. To complete switching of the free layer 162', a CPP current, $J_{STT}$, may be driven through the magnetic junction 160'. The CPP current exerts an STT torque on the magnetic moment 163' of the free layer 162'. The free layer 162' magnetic moment 163' may be switched using the STT torque and torque from accumulated spins. The write operation may thus be completed. For a read operation, a read current may be driven through the magnetic junction 160' in the direction of $J_{STT}$. The resistance of the magnetic junction 160' may be used to determine whether the magnetic junction 160' is in a high resistance state or a low resistance state.

Thus, the benefits of the magnetic junction 160 may be achieved for the magnetic junction 160' having a free layer magnetic moment 163' perpendicular-to-plane. The spin accumulation induced torque has perturbed the reference layer magnetic moment 167' and, therefore, the tilted free layer magnetic moment 163' from the stagnation point/easy axis. Consequently, the STT based switching may be faster. This more rapid switching may be undertaken using well known materials for the magnetic layer 172' and nonmagnetic layer 174' of the SSV line 170'. In addition, because the current corresponding to $J_{SSV}$ is in-plane, a larger current may be used. A larger spin accumulation based torque may thus be generated. Switching of the magnetic junction 160' may thus be facilitated.

Figure 9:
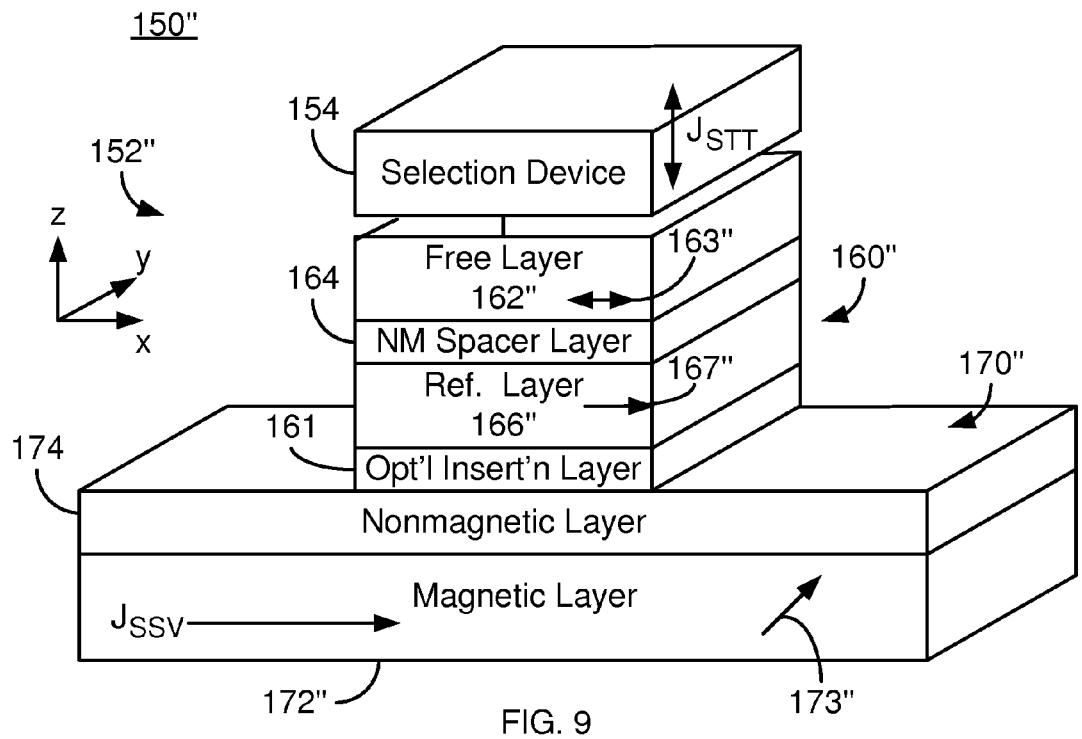
FIG. 9 depicts another exemplary embodiment of a portion of a magnetic memory that includes a dual magnetic junction switched using spin-orbit interaction.

FIG. 9 depicts a perspective view of another exemplary embodiment of a portion of a magnetic memory 150" that includes magnetic junction 160" switched using accumulated charge carriers. The magnetic memory 150" may be used in devices that utilize RAM, particularly MRAM, including but not limited to cellular phones, other mobile devices and computing devices. For clarity, FIG. 9 is not to scale. In addition, portions of the magnetic memory 150" such as bit lines, word lines, row selectors and column selectors are not shown or not labeled as such. The magnetic memory 150" is analogous to the magnetic memory 150. The magnetic memory 150" thus includes a magnetic storage cell 152" and an SSV line 170" analogous to the magnetic storage cell 152 and SSV line 170, respectively. The magnetic storage cell 152" includes a magnetic junction 160" and a selection device 154 analogous to the components 152 and 160, respectively. In some embodiments, the magnetic storage cell 152" may have additional components including but not limited to another magnetic junction and one or more additional selection devices. The magnetic storage cell may be one of a number of magnetic storage cells ordered in an array. Similarly, multiple SSV lines 170" may be used in the magnetic memory 150".

The magnetic junction 160" includes an optional insertion layer 161, a free layer 162", a nonmagnetic spacer layer 164 and a reference layer 166" analogous to optional insertion layer 151, the free layer 162, nonmagnetic spacer layer 164 and reference layer 166, respectively. Although depicted as a single magnetic junction, the magnetic junction 160" may be a dual magnetic junction including an additional nonmagnetic spacer layer and an additional reference layer. In such embodiments, the free layer is between the two nonmagnetic spacer layers. Further, the additional nonmagnetic spacer layer is between the free layer and the additional reference layer. The magnetic moments 163" and 167" of the free layer 162" and reference layer 166", respectively, are also shown. The free layer magnetic moment 163" is in-plane and switchable using a combination of accumulated spin torque and STT based switching. Because the magnetic moment 163" of the free layer 162 is switchable, it is depicted as a dual headed arrow. In addition, the easy axis of the free layer 162" is aligned with the magnetic moment 163". The reference layer magnetic moment 167" is also in-plane and along the current direction. In the magnetic junction 160", the reference layer 166" is between the free layer 162" and the SSV line 170". In embodiments in which the optional insertion layer 161" is omitted, the reference layer 166" may adjoin the SSV line 170".

The SSV line 170" includes a magnetic layer 172" and a nonmagnetic layer 174" that are analogous to the magnetic layer 172 and the nonmagnetic layer 174, respectively. In addition, the magnetic moment 173" of the magnetic layer 172" is shown. The magnetic moment 173" is substantially perpendicular to the magnetic moment 167" of the reference layer 166", but still in-plane. The magnetic moment 173" is also substantially perpendicular to the magnetic moment 163" of the free layer 162". In other embodiments, other angles are possible. However, the magnetic moment 173" is desired to be angled from the magnetic moment 167" of the reference layer 166". The magnetic moment of the magnetic layer 172" is generally desired to remain fixed throughout operation of the magnetic memory 150". Materials that may be used for the magnetic layer 152" may include one or more of the following elements Fe, Co, Ni, Pt, Pd, Mn, Y, Cr, Ru, Rh, W, Ta, B, Bi, Ir, Pb, B, N, O; but other materials may also be used. The nonmagnetic layer 174" is between the magnetic layer 172" and the magnetic junction 160". The magnetic layer 174" may include one or more of the following elements Cu, Ag, Au, Ta, W, and N. However, in other embodiments, other nonmagnetic materials may be used.

The magnetic memory 150" functions in an analogous manner to the magnetic memory 150. For a write operation, an in-plane current, for example corresponding to $J_{SSV}$, is driven through the SSV line 170". In some embodiments, current may be prevented from flowing through the magnetic junction 160" for at least a portion of the time that the in-plane current flows through the SSV line 170". Use of a magnetic junction 110" having a higher resistance than the SSV line 120" and/or deselecting the magnetic junction 110" may aid in preventing current from flowing through the magnetic junction 110" and allowing spin polarized charge carriers to accumulate near the magnetic junction 110". Charge carriers that are spin polarized in the parallel to the magnetic moment 173" accumulate in the nonmagnetic layer 174" near the magnetic junction 160". The torque from these accumulated spins tilts the magnetic moment 167" of the reference layer 166" while the torque is exerted on the magnetic moment 167", which perturbs the magnetic moment 163" of the free layer 162". The magnetic moment 163" of the free layer 162" may thus be tilted away from the stagnation point for STT switching. To complete switching of the free layer 162", a CPP current, $J_{STT}$, may be driven through the magnetic junction 160", which exerts an STT torque on the magnetic moment 163" of the free layer 162". The write operation may thus be completed. For a read operation, a read current may be driven through the magnetic junction 160" in the direction of $J_{STT}$. The resistance of the magnetic junction 160" may be used to determine whether the magnetic junction 160" is in a high resistance state or a low resistance state.

Thus, the benefits of the magnetic junction 160 may be achieved for the magnetic junction 160" having a free layer magnetic moment 163" perpendicular-to-plane. The spin accumulation induced torque has perturbed the reference layer magnetic moment 167" and, therefore, the tilted free layer magnetic moment 163" from the stagnation point/easy axis. Consequently, the STT based switching may be faster. This more rapid switching may be undertaken using well known materials for the magnetic layer 172" and nonmagnetic layer 174" of the SSV line 170". In addition, because the current corresponding to $J_{SSV}$ is in-plane, a larger current may be used. A larger spin accumulation based torque may thus be generated. Switching of the magnetic junction 160" may thus be facilitated.

Figure 10:
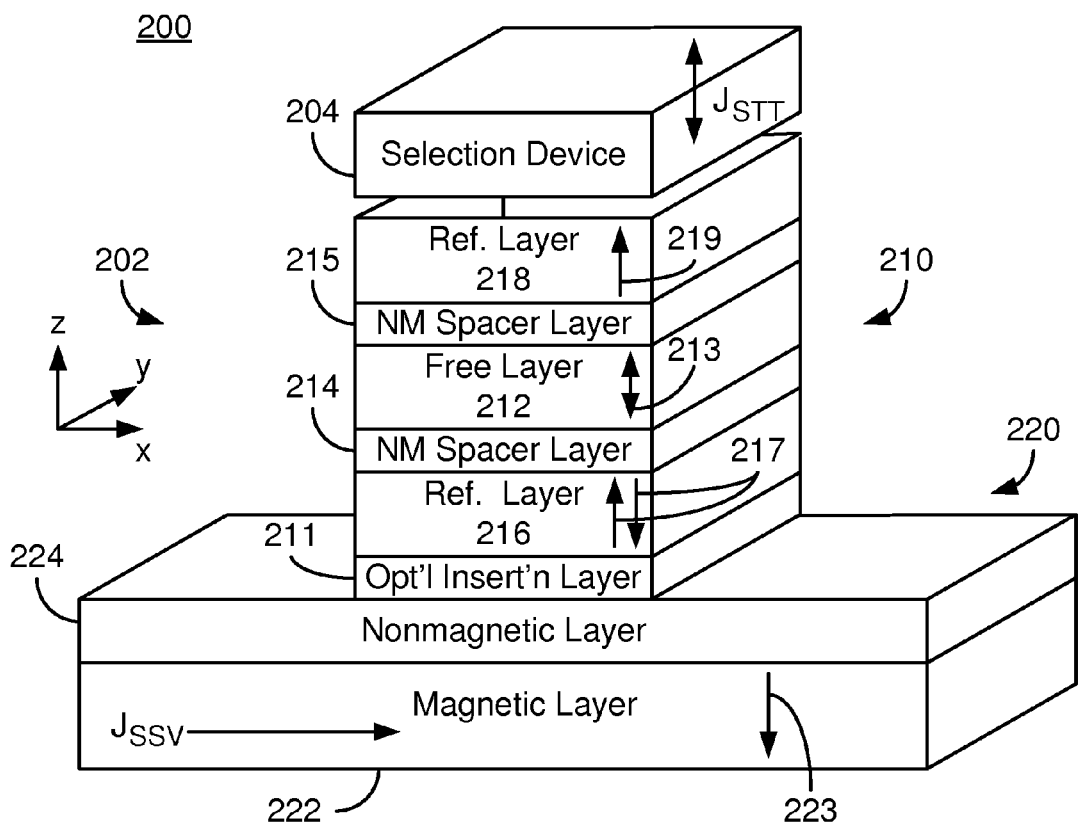
FIG. 10 depicts another exemplary embodiment of a portion of a magnetic memory that includes a dual magnetic junction switched using spin-orbit interaction.

FIG. 10 depicts a perspective view of another exemplary embodiment of a portion of a magnetic memory 200 that includes magnetic junction 210 switched using accumulated charge carriers. The magnetic memory 200 may be used in devices that utilize RAM, particularly MRAM, including but not limited to cellular phones, other mobile devices and computing devices. For clarity, FIG. 10 is not to scale. In addition, portions of the magnetic memory 200 such as bit lines, word lines, row selectors and column selectors are not shown or not labeled as such. The magnetic memory 200 is analogous to the magnetic memories 100 and/or 150. The magnetic memory 200 thus includes a magnetic storage cell 212 and an SSV line 220 analogous to the magnetic storage cell 102/152 and SSV line 120/170, respectively. The magnetic storage cell 202 includes a magnetic junction 210 and a selection device 204 analogous to the components 102/152 and 110/160, respectively. In some embodiments, the magnetic storage cell 202 may have additional components including but not limited to another magnetic junction and one or more additional selection devices. The magnetic storage cell may be one of a number of magnetic storage cells ordered in an array. Similarly, multiple SSV lines 220 may be used in the magnetic memory 200.

The magnetic junction 210 includes an optional insertion layer 211, a free layer 212, a nonmagnetic spacer layer 214 and a reference layer 216 analogous to optional insertion layer 111/161, the free layer 112/162, nonmagnetic spacer layer 114/154 and reference layer 116/166, respectively. The magnetic junction 210 is, however, a dual magnetic junction. Consequently, the magnetic junction 210 also includes an additional nonmagnetic spacer layer 215 and an additional reference layer 218. The additional nonmagnetic spacer layer 215 is analogous to the nonmagnetic spacer layer 214. Thus, the additional nonmagnetic spacer layer 215 may be a crystalline MgO tunneling barrier layer, a conductive layer, or other nonmagnetic layer. The additional reference layer 218 is analogous to the reference layer 216 in that the reference layer 218 has a magnetic moment 219 that that is fixed, or pinned, during reading of the magnetic junction 210. The magnetic moment 219 is also fixed during writing of the magnetic junction 210. The magnetic moments 213, 217 and 219 of the free layer 212 and reference layers 216 and 218, respectively, are also shown. The free layer magnetic moment 213 is perpendicular-to-plane and switchable using STT based switching. Because the magnetic moment 213 of the free layer 212 is switchable, it is depicted as a dual headed arrow. In addition, the easy axis of the free layer 212 is in the same direction as the magnetic moment 213. As discussed below, the reference layer 216 may be switched to a dual state for writing using spin accumulation based torque. As such, the free layer 212 may also be considered switchable/writable using spin accumulation based torque in addition to spin transfer torque.

The SSV line 220 includes a magnetic layer 222 and a nonmagnetic layer 224 that are analogous to the magnetic layer 122/172 and the nonmagnetic layer 124/174, respectively. In addition, the magnetic moment 223 of the magnetic layer 222 is shown. The magnetic moment 223 may be parallel or antiparallel to the magnetic moment 219 of the reference layer 218. The magnetic moment of the magnetic layer 222 is generally desired to remain fixed throughout operation of the magnetic memory 200. Materials that may be used for the magnetic layer 202 may include one or more of the following elements Fe, Co, Ni, Pt, Pd, Mn, Y, Cr, Ru, Rh, W, Ta, B, Bi, Ir, Pb, B, N, O; but other materials may also be used. The nonmagnetic layer 224 is between the magnetic layer 222 and the magnetic junction 210. The magnetic layer 224 may include one or more of the following elements Cu, Ag, Au, Ta, W, and N. However, in other embodiments, other nonmagnetic materials may be used.

Using the SSV line 210 and the magnetic junction 210 may be switched between the dual state and the antidual state for reading and writing. The magnetic moment 217 of the reference layer 216 is switchable between states. Thus, two arrows are shown in FIG. 10 for the magnetic moment 217. For higher read signal is it desirable that the magnetic moment 217 of the reference layer 216 is parallel to the magnetic moment 219 of the reference layer 218 during the read operation, thus the magnetic junction is in the anti-dual state. Thus for a read operation, the magnetic moment 217 of the reference layer 216 may be switched into the antidual state. This switching may be accomplished using spin accumulation induced torque. For example, for a read operation, an in-plane current, for example corresponding to $-J_{SSV}$, is driven through the SSV line 220. Polarized spins accumulate in the nonmagnetic layer 224 near the magnetic junction 210. The torque from these accumulated spins may switch the magnetic moment 217 of the reference layer 216 in the direction of the magnetic moment 219 of the reference layer 215. Thus, the magnetic junction 210 may be placed in the anti-dual state for reading. In other embodiments, the magnetic moment 217 may be in another direction for the read operation. For example, the magnetic moment 217 may be perpendicular to the free layer magnetic moment 213 during reading and/or in the absence of spin accumulation based torque. For a read operation, a read current may be driven through the magnetic junction 210 in the direction of $J_{STT}$. The resistance of the magnetic junction 210 may be used to determine whether the magnetic junction 210 is in a high resistance state or a low resistance state.

For a write operation, the magnetic moment 217 of the reference layer 216 is switched to be in the dual state. This switching may be accomplished using spin accumulation induced torque. For example, for a write operation, an in-plane current, for example corresponding to $J_{SSV}$, is driven through the SSV line 220. In some embodiments, current may be prevented from flowing through the magnetic junction 210 for at least a portion of the time that the in-plane current flows through the SSV line 220. Using a magnetic junction 210 having a higher resistance than the SSV line 220 and/or deselecting the magnetic junction 210 may aid in preventing current from flowing through the magnetic junction 210 and allowing spin polarized charge carriers to accumulate near the magnetic junction 210. Polarized spins accumulate in the nonmagnetic layer 224 near the magnetic junction 210. The torque from these accumulated spins may switch the magnetic moment 217 of the reference layer 216 in the direction antiparallel to the magnetic moment 219 of the reference layer 215. Thus, the magnetic junction 210 may be placed in the dual state for programming. To complete switching of the free layer 212, a CPP current is driven through the magnetic junction 210 while the in-plane current is driven through the SSV line 220. As a result, STT torque is exerted on the magnetic moment 213 of the free layer 212 while the magnetic moments 217 and 219 of the reference layers 216 and 218, respectively, are in the dual state. The free layer 212 may thus be switched using spin transfer torque.

Because the magnetic junction 210 may be switched using spin transfer torque, the magnetic junction 210 may be written using a localized phenomenon. The benefits of an STT based memory may thus be achieved. Further, using spin accumulation induced torque, the reference layers 216 and 218 may switched between the dual and antidual states for writing and reading, respectively. While in the dual state for writing, the spin transfer torque is enhanced. Similarly, the antidual state enhances the magnetoresistance of the magnetic junction 210. Thus, reading and writing of the magnetic junction 210 may be improved.

Figure 11:
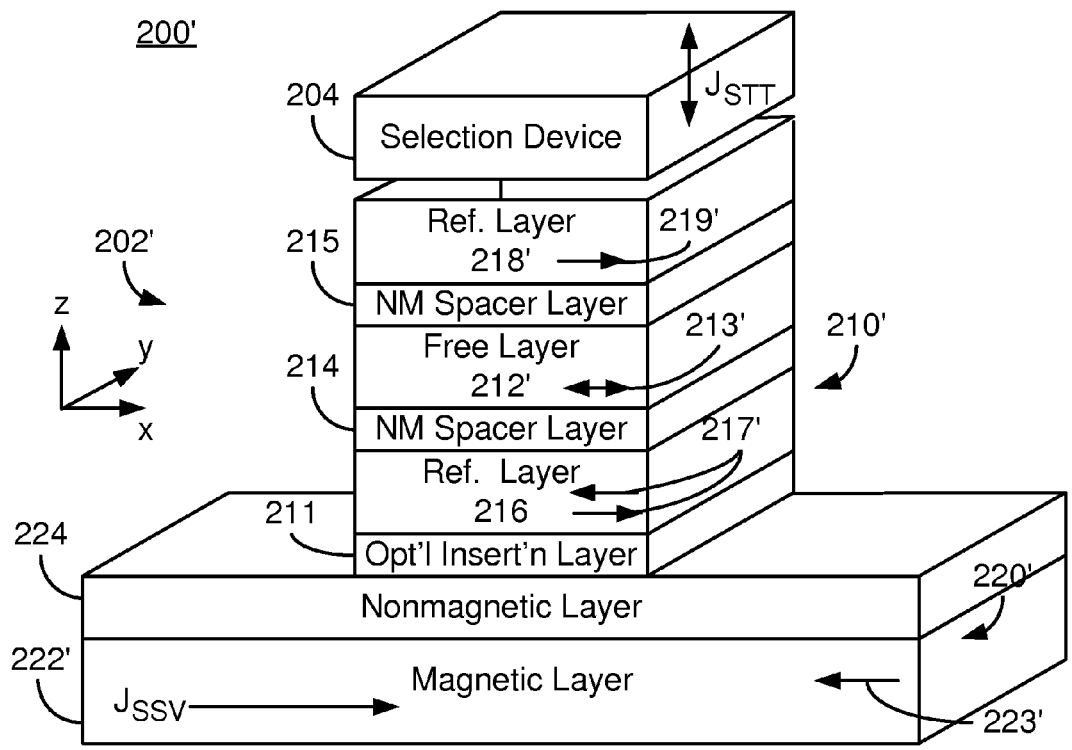
FIG. 11 depicts another exemplary embodiment of a portion of a magnetic memory that includes a dual magnetic junction switched using spin-orbit interaction.

FIG. 11 depicts a perspective view of another exemplary embodiment of a portion of a magnetic memory 200' that includes magnetic junction 210' switched using accumulated charge carriers and spin transfer torque. The magnetic memory 200' may be used in devices that utilize RAM, particularly MRAM, including but not limited to cellular phones, other mobile devices and computing devices. For clarity, FIG. 11 is not to scale. In addition, portions of the magnetic memory 200' such as bit lines, word lines, row selectors and column selectors are not shown or not labeled as such. The magnetic memory 200' is analogous to the magnetic memory 200. The magnetic memory 200' thus includes a magnetic storage cell 202' and an SSV line 220' analogous to the magnetic storage cell 202 and SSV line 220, respectively. The magnetic storage cell 202' includes a magnetic junction 210' and a selection device 204 analogous to the components 210 and 204, respectively. In some embodiments, the magnetic storage cell 202' may have additional components including but not limited to another magnetic junction and one or more additional selection devices. The magnetic storage cell may be one of a number of magnetic storage cells ordered in an array. Similarly, multiple SSV lines 220' may be used in the magnetic memory 200'.

The magnetic junction 210' includes an optional insertion layer 211, a reference layer 216', a nonmagnetic spacer layer 214, a free layer 212', a nonmagnetic spacer layer 215 and a reference layer 218' analogous to optional insertion layer 211, the reference layer 216, the nonmagnetic spacer layer 214, the free layer 212, the nonmagnetic spacer layer 215 and the reference layer 218, respectively. The magnetic moments 213', 217' and 219' of the free layer 212', the reference layer 216' and reference layer 218', respectively, are also shown. The free layer magnetic moment 213' is in-plane and switchable using STT based switching. Because the magnetic moment 213' of the free layer 212 is switchable, it is depicted as a dual headed arrow. In addition, the easy axis of the free layer 212' is aligned with the magnetic moment 213'. The reference layer 216' may be switched to a dual state for writing using spin accumulation based torque. As such, the free layer 212' may also be considered switchable/writable using spin accumulation based torque in addition to spin transfer torque.

The SSV line 220' includes a magnetic layer 222' and a nonmagnetic layer 224' that are analogous to the magnetic layer 222 and the nonmagnetic layer 224, respectively. In addition, the magnetic moment 223' of the magnetic layer 222' is shown. The magnetic moment 223' may be parallel or antiparallel to the magnetic moment 219' of the reference layer 218'. The magnetic moment of the magnetic layer 222' is generally desired to remain fixed throughout operation of the magnetic memory 200'. Materials that may be used for the magnetic layer 202' may include one or more of the following elements Fe, Co, Ni, Pt, Pd, Mn, Y, Cr, Ru, Rh, W, Ta, B, Bi, Ir, Pb, B, N, O; but other materials may also be used. The nonmagnetic layer 224' is between the magnetic layer 222' and the magnetic junction 210'. The magnetic layer 224' may include one or more of the following elements Cu, Ag, Au, Ta, W, and N. However, in other embodiments, other nonmagnetic materials may be used.

The magnetic memory 200' functions in an analogous manner to the magnetic memory 200. Using the SSV line 220' and the magnetic junction 210' may be switched between the dual state and the antidual state for reading and writing. Thus, two arrows are shown in FIG. 11 for the magnetic moment 217'. For a read operation, the magnetic moment 217' of the reference layer 216' may be switched into the antidual state, i.e. parallel with the magnetic moment 219' of the reference layer 218'. This switching may be accomplished using spin accumulation induced torque. For example, for a read operation, an in-plane current, for example corresponding to $-J_{SSV}$, is driven through the SSV line 220'. Polarized spins accumulate in the nonmagnetic layer 224' near the magnetic junction 210'. The torque from these accumulated spins may switch the magnetic moment 217' of the reference layer 216' in the direction of the magnetic moment 219' of the reference layer 215'. Thus, the magnetic junction 210' may be placed in the anti-dual state for reading. In other embodiments, the magnetic moment 217' may be in another direction for the read operation. For a read operation, a read current may be driven through the magnetic junction 210' in the direction of $J_{STT}$. For a write operation, the magnetic moment 217' of the reference layer 216' is switched to be in the dual state using spin accumulation induced torque. For example, for a write operation, an in-plane current, for example corresponding to $J_{SSV}$, is driven through the SSV line 220'. In some embodiments, current may be prevented from flowing through the magnetic junction 210' for at least a portion of the time that the in-plane current flows through the SSV line 220'. Polarized spins accumulate in the nonmagnetic layer 224' near the magnetic junction 210'. The torque from these accumulated spins may switch the magnetic moment 217' of the reference layer 216' in the direction antiparallel to the magnetic moment 219' of the reference layer 215'. Thus, the magnetic junction 210' may be placed in the dual state for programming. To complete STT switching of the free layer 212', a CPP current is driven through the magnetic junction 210' while the in-plane current is driven through the SSV line 220'.

The magnetic memory 200' may share the benefits of the magnetic junction 200. Because the magnetic junction 210' may be switched using spin transfer torque, the benefits of an STT based memory may thus be achieved. Further, using spin accumulation induced torque, the reference layers 216' and 218' may switched between the dual and antidual states for writing and reading, respectively. Thus, reading and writing of the magnetic junction 210' may be improved.

Figure 12:
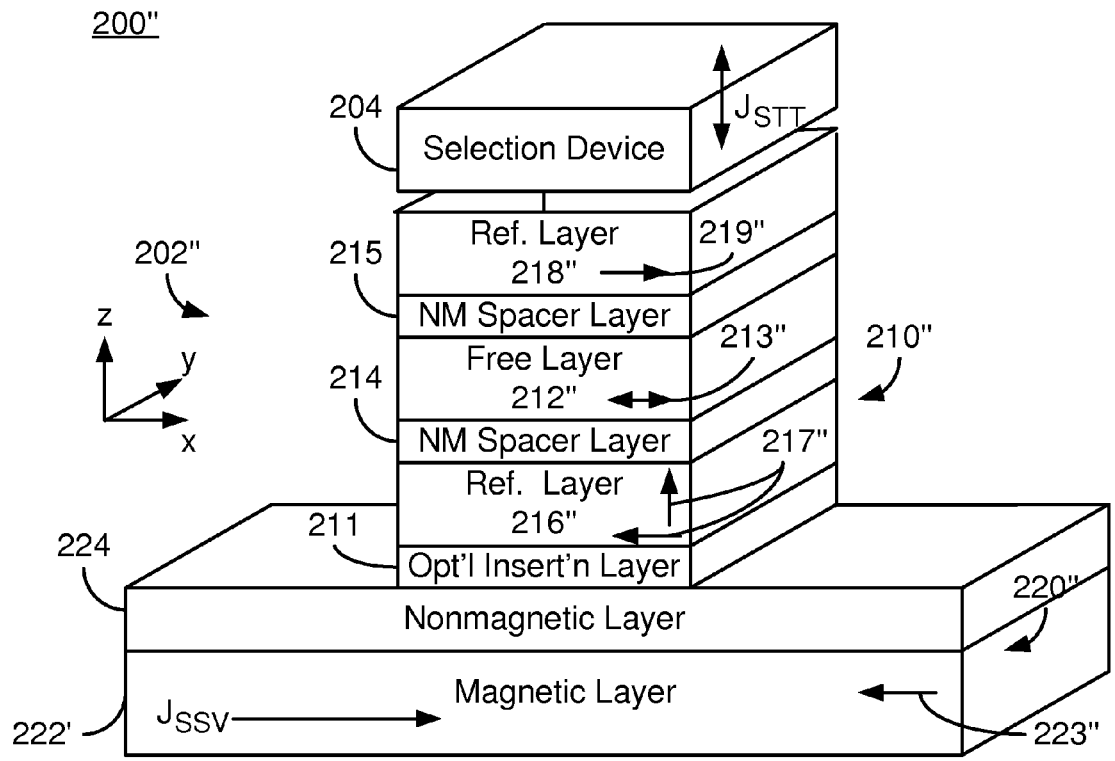
FIG. 12 depicts another exemplary embodiment of a portion of a magnetic memory that includes a dual magnetic junction switched using spin-orbit interaction.

FIG. 12 depicts a perspective view of another exemplary embodiment of a portion of a magnetic memory 200" that includes magnetic junction 210" switched using accumulated charge carriers and spin transfer torque. The magnetic memory 200" may be used in devices that utilize RAM, particularly MRAM, including but not limited to cellular phones, other mobile devices and computing devices. For clarity, FIG. 12 is not to scale. In addition, portions of the magnetic memory 200" such as bit lines, word lines, row selectors and column selectors are not shown or not labeled as such. The magnetic memory 200" is analogous to the magnetic memory 200. The magnetic memory 200" thus includes a magnetic storage cell 202' and an SSV line 220" analogous to the magnetic storage cell 202 and SSV line 220, respectively. The magnetic storage cell 202" includes a magnetic junction 210' and a selection device 204" analogous to the components 210 and 204, respectively. In some embodiments, the magnetic storage cell 202' may have additional components including but not limited to another magnetic junction and one or more additional selection devices. The magnetic storage cell may be one of a number of magnetic storage cells ordered in an array. Similarly, multiple SSV lines 220" may be used in the magnetic memory 200'.

The magnetic junction 210" includes an optional insertion layer 211, a reference layer 216", a nonmagnetic spacer layer 214, a free layer 212", a nonmagnetic spacer layer 215 and a reference layer 218" analogous to optional insertion layer 211, the reference layer 216, the nonmagnetic spacer layer 214, the free layer 212, the nonmagnetic spacer layer 215 and the reference layer 218, respectively. The magnetic moments 213", 217" and 219" of the free layer 212", the reference layer 216" and reference layer 218", respectively, are also shown. The free layer magnetic moment 213" is in-plane and switchable using STT based switching. However, in another embodiment, the free layer magnetic moment 213" may be in another direction including but not limited to perpendicular to plane. Because the magnetic moment 213" of the free layer 212" is switchable, it is depicted as a dual headed arrow. In addition, the easy axis of the free layer 212" is aligned with the magnetic moment 213". The reference layer 216" may be switched to a dual state for writing using spin accumulation based torque. As such, the free layer 212" may also be considered switchable/writable using spin accumulation based torque in addition to spin transfer torque.

The SSV line 220" includes a magnetic layer 222" and a nonmagnetic layer 224" that are analogous to the magnetic layer 222 and the nonmagnetic layer 224, respectively. In addition, the magnetic moment 223" of the magnetic layer 222" is shown. The magnetic moment 223" is substantially antiparallel to the magnetic moment 219" of the reference layer 218". The magnetic moment of the magnetic layer 222" is generally desired to remain fixed throughout operation of the magnetic memory 200". Materials that may be used for the magnetic layer 202" may include one or more of the following elements Fe, Co, Ni, Pt, Pd, Mn, Y, Cr, Ru, Rh, W, Ta, B, Bi, Ir, Pb, B, N, O; but other materials may also be used. The nonmagnetic layer 224" is between the magnetic layer 222" and the magnetic junction 210". The magnetic layer 224" may include one or more of the following elements Cu, Ag, Au, Ta, W, and N. However, in other embodiments, other nonmagnetic materials may be used.

The magnetic memory 200" functions in an analogous manner to the magnetic memory 200. Using the SSV line 220" and the magnetic junction 210' may be switched between the dual state and a read state for writing and reading, respectively. Thus, two arrows are shown in FIG. 12 for the magnetic moment 217". For a read operation, the magnetic moment 217" of the reference layer 216" may be angled from with the magnetic moment 219" of the reference layer 218". This may be the equilibrium state of the reference layer 216" in the absence of a spin accumulation based torque. In other embodiments, the magnetic moment 217" may be in another direction for the read operation. For a read operation, a read current may be driven through the magnetic junction 210" in the direction of $J_{STT}$.

For a write operation, the magnetic moment 217" of the reference layer 216" is switched to be in the dual state using spin accumulation induced torque. For example, for a write operation, an in-plane current, for example corresponding to $J_{SSV}$, is driven through the SSV line 220". In some embodiments, current may be prevented from flowing through the magnetic junction 210" for at least a portion of the time that the in-plane current flows through the SSV line 220". Spins polarized in the –x direction (parallel to the magnetic moment 223') accumulate in the nonmagnetic layer 224" near the magnetic junction 210". The torque from these accumulated spins tilts the magnetic moment 217" of the reference layer 216" in the direction of the magnetic moment 223" of the magnetic layer 222". Thus, the magnetic junction 210" may be placed in the dual state for programming. To complete STT switching of the free layer 212", a CPP current is driven through the magnetic junction 210" while the in-plane current is driven through the SSV line 220".

The magnetic memory 200 may share the benefits of the magnetic junction 200. Because the magnetic junction 210" may be switched using spin transfer torque, the benefits of an STT based memory may thus be achieved. Further, using spin accumulation induced torque, the reference layers 216" and 218" may switched between the dual and read states for writing and reading, respectively. Thus, reading and writing of the magnetic junction 210" may be improved.

Figure 13:
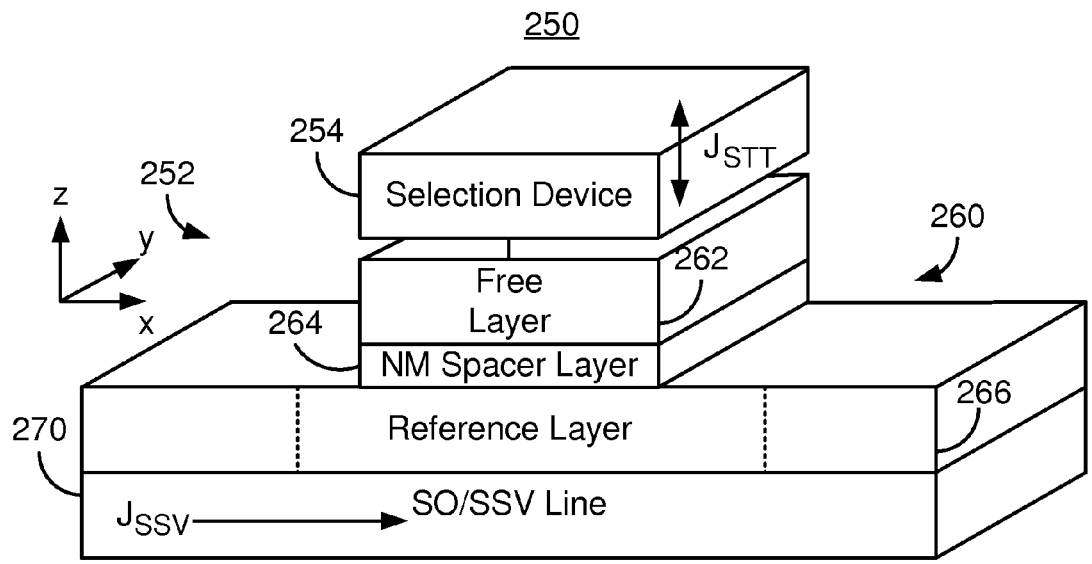
FIG. 13 depicts an exemplary embodiment of a portion of a memory including dual magnetic junctions switched using spin-orbit interaction.

FIG. 13 depicts a perspective view of another exemplary embodiment of a portion of a magnetic memory 250 that includes magnetic junction 260 switched using accumulated charge carriers. The charge carriers may be accumulated due to the spin orbit effect and/or to the SSV configuration of the line. The magnetic memory 250 may be used in devices that utilize RAM, particularly MRAM, including but not limited to cellular phones, other mobile devices and computing devices. For clarity, FIG. 13 is not to scale. In addition, portions of the magnetic memory 250 such as bit lines, word lines, row selectors and column selectors are not shown or not labeled as such. The magnetic memory 250 is analogous to the magnetic memories 100, 150 and/or 200. The magnetic memory 250 thus includes a magnetic storage cell 262 and a line 270. The line 270 is either a spin orbit active line (SO) line analogous to the line 70 depicted in FIG. 2 or an SSV line analogous to the SSV line 120/170/220, respectively. Consequently, the line 270 is termed an SO/SSV line 270. The magnetic storage cell 252 includes a magnetic junction 260 and a selection device 254 analogous to the components 102/152/202 and 110/160/210, respectively. In some embodiments, the magnetic storage cell 252 may have additional components including but not limited to another magnetic junction and one or more additional selection devices. The magnetic storage cell may be one of a number of magnetic storage cells ordered in an array. Similarly, multiple SSV lines 270 may be used in the magnetic memory 250.

The magnetic junction 260 includes a free layer 262, a nonmagnetic spacer layer 264 and an extended reference layer 266 analogous to the free layer 112/162/212, nonmagnetic spacer layer 114/154/214 and reference layer 116/166/216, respectively. The free layer magnetic moment may thus be in-plane, perpendicular to plane, or in some other direction when the magnetic memory cell 252 is quiescent (e.g. not being programmed). Likewise, the reference layer magnetic moment may be in plane or perpendicular to plane when quiescent. In some embodiments, the magnetic moments of the free layer 262 and extended reference layer 266 share the same direction. For example, both may be in-plane or both may be perpendicular-to-plane. In other embodiments, the magnetic moment of the free layer 262 may be perpendicular to the extended reference layer 266 when the magnetic memory cell 252 is quiescent. For example, the free layer magnetic moment may be perpendicular-to-plane while the extended reference layer magnetic moment is in plane.

The extended reference layer 266 is so termed because it extends further in the direction of the line 270 than the free layer 262 does. In some embodiments, the reference layer 266 is substantially continuous over multiple magnetic memory cells in the current direction. In some embodiments, such embodiments, the extended reference layer 266 extends substantially as far as the SO.SSV line 270. In other embodiments, the extended reference layer 266 simply functions as a reference layer for two or more memory cells. However, in other embodiments, the reference layer 266 may simply extend further than the free layer 262. Such an embodiment is denoted by dashed lines in FIG. 13. It is desirable for the reference layer 266 to be single domain. Further, the reference layer 266 may be desired to have a higher resistivity than the SO/SSV line 270 to prevent current from shunting away from the SO/SSV line 270.

Operation of the magnetic memory 250 may be analogous to the magnetic memory 50 or the magnetic memory 100, 150, and/or 200 in that an in-plane current, e.g. $J_{SO/SSV}$, may be driven through the SSO/SV line 270. Using the SO/SSV line 270. The magnetic moment of the extended reference layer 266 may be tilted from its pinned/quiescent direction by spin polarized accumulated charge carriers near the reference layer 266. These spin polarized charge carriers may accumulate due to the spin orbit effect or because of the SSV construction of the line 270. Note that for the spin-orbit effect the direction of polarization changes based on the current direction. However, for an SSV line, the direction of polarization is the same (e.g. the direction of the magnetic moment of the magnetic layer) for either current direction. A CPP current, $J_{STT}$, is driven through the magnetic junction 260 to complete switching. For a read operation, the read current may be driven through the magnetic junction 260 in the direction of $J_{STT}$. The resistance of the magnetic junction 260 may be used to determine whether the magnetic junction 260 is in a high resistance state or a low resistance state.

Because the magnetic junction 260 may be switched using spin transfer torque, the magnetic junction 260 may be written using a localized phenomenon. The benefits of an STT based memory may thus be achieved. Further, using spin accumulation induced torque, the extended reference layer 266 may allow for faster switching. In addition, the extended reference layer 266 may result in reduced stray fields at the free layer 262 and/or better stability for lower coercivities of the free layer. Consequently, performance of the magnetic memory 250 may be improved.

Figure 14:
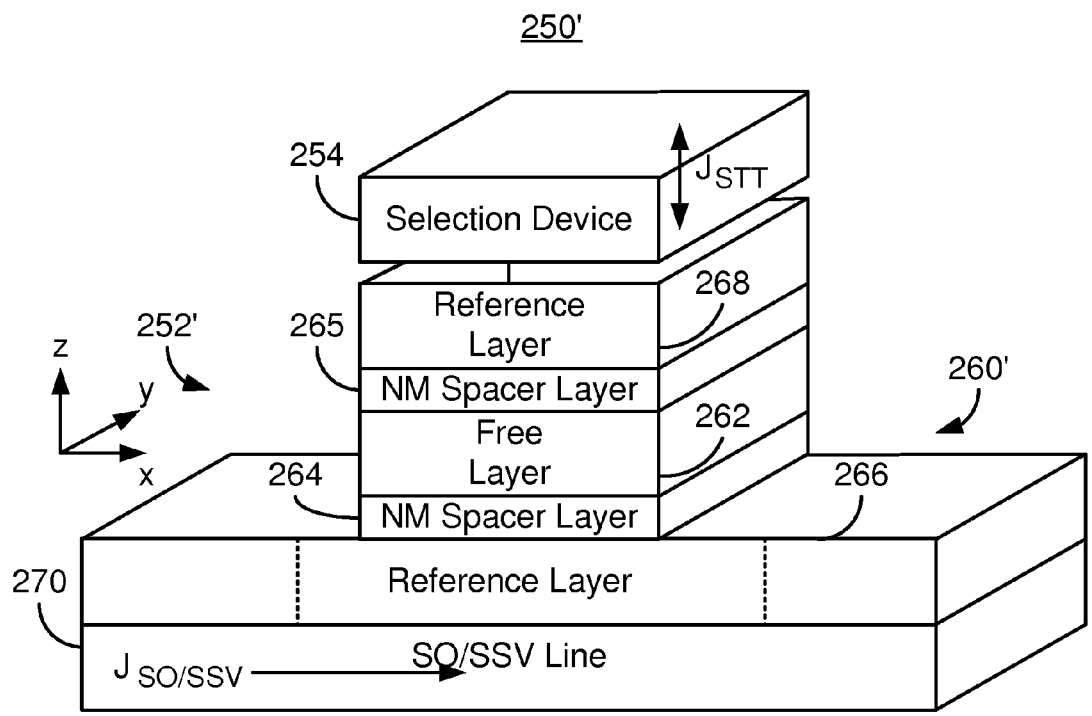
FIG. 14 depicts another exemplary embodiment of a portion of a memory including dual magnetic junctions switched using spin-orbit interaction.

FIG. 14 depicts a perspective view of another exemplary embodiment of a portion of a magnetic memory 250' that includes magnetic junction 260' switched using accumulated charge carriers. The charge carriers may be due to the spin orbit effect or due to the SSV configuration of the line. The magnetic memory 250' may be used in devices that utilize RAM, particularly MRAM, including but not limited to cellular phones, other mobile devices and computing devices. For clarity, FIG. 14 is not to scale. In addition, portions of the magnetic memory 250' such as bit lines, word lines, row selectors and column selectors are not shown or not labeled as such. The magnetic memory 250' is analogous to the magnetic memory 250. The magnetic memory 250' thus includes a magnetic storage cell 262' and an SO/SSV line 270 analogous to the magnetic storage cell 262 and the SO/SSV line 270, respectively.

The magnetic junction 260' includes a free layer 262, a nonmagnetic spacer layer 264 and an extended reference layer 266 analogous to the free layer 262, nonmagnetic spacer layer 264 and reference layer 266, respectively. In addition, the magnetic junction 260' includes an additional nonmagnetic spacer layer 265 and an additional reference layer 268. These layers are thus analogous to the layers 215/215'/215" and 218/218'/218" in FIGS. 10-12. The free layer magnetic moment may thus be in-plane, perpendicular to plane, or in some other direction when the magnetic memory cell 252' is quiescent (e.g. not being programmed). The magnetic moment of the reference layer 268 is set to be aligned with the easy axis of the free layer 266. For example, the magnetic moment of the reference layer 268 is perpendicular-to-plane when the magnetic moment of the free layer 266 is perpendicular-to-plane. The magnetic moment of the reference layer 266 may be in plane or perpendicular to plane when quiescent. In some embodiments, the magnetic moments of the free layer 262 and extended reference layer 266 share the same direction. For example, both may be in-plane or both perpendicular-to-plane. In other embodiments, the magnetic moment of the free layer 262 may be perpendicular to the extended reference layer 266 when the magnetic memory cell 252 is quiescent. For example, the free layer magnetic moment may be perpendicular-to-plane while the extended reference layer magnetic moment is in plane.

The extended reference layer 266 extends further in the direction of the line 270 than the free layer 262 does. In some embodiments, the reference layer 266 is substantially continuous over multiple magnetic memory cells in the current direction. In some embodiments, such embodiments, the extended reference layer 266 extends substantially as far as the SO.SSV line 270. In other embodiments, the extended reference layer 266 simply functions as a reference layer for two or more memory cells. However, in other embodiments, the reference layer 266 may simply extend further than the free layer 262. Such an embodiment is denoted by dashed lines in FIG. 14. It is desirable for the reference layer 266 to be single domain. Further, the reference layer 266 may be desired to have a higher resistivity than the SO/SSV line 270 to prevent current from shunting away from the SO/SSV line 270.

Operation of the magnetic memory 250 may be analogous to the magnetic memory 50 or the magnetic memory 100, 150, and/or 200 in that an in-plane current, e.g. $J_{SO/SSV}$, may be driven through the SSO/SV line 270 using the SO/SSV line 270. More specifically, the magnetic junction 260 may be switched between the dual state and another state for writing and reading. In some embodiments, the reference layers 266 and 268 are in the antidual state for reading. In other embodiments, the reference layers 266 and 268 may have perpendicular magnetic moments during reading. To achieve this, the magnetic moment of the extended reference layer 266 is switchable between states using torque generated by accumulated charge carriers. For a read operation, the magnetic moment of the reference layers 266 and 268 may be in the antidual state in some embodiments. In other embodiments, magnetic moment of the extended reference layer 266 may be perpendicular to the free layer magnetic moment during a read operation. Thus, when quiescent, the magnetic moment of the reference layer 266 is either parallel or perpendicular to the magnetic moment of the reference layer 268. A read current driven through the magnetic junction 260 in the direction of $J_{STT}$ and the resistance of the magnetic junction 260 determined.

For a write operation, the magnetic moment of the extended reference layer 266 is switched to be in the dual state with respect to the magnetic moment of the reference layer 268. This switching may be accomplished using spin accumulation induced torque. The current carriers accumulated near the extended reference layer 266 may be due to spin orbit coupling or the SSV configuration of the line 270. For a write operation, an in-plane current, for example corresponding to $J_{SO/SSV}$, is driven through the SO/SSV line 270. In some embodiments, current may be shunted away from the extended reference layer 266 because of its higher resistivity. Spins polarized in the direction of the magnetic moment of the line 270 or polarized by an SO active layer (not specifically shown in FIG. 14) accumulate near the magnetic junction 260. The torque from these accumulated spins switch the magnetic moment of the reference layer 266. Thus, the magnetic junction 260 may be placed in the dual state for programming. To complete switching of the free layer 262, a CPP current is driven through the magnetic junction 260 while the in-plane current is driven through the SO/SSV line 270. As a result, STT torque is exerted on the magnetic moment of the free layer 262 while the magnetic moments of the reference layers 266 and 268 are in the dual state. The free layer 262 may thus be switched using spin transfer torque.

Because the magnetic junction 260 may be switched using spin transfer torque, the magnetic junction 260 may be written using a localized phenomenon. The benefits of an STT based memory may thus be achieved. Further, using spin accumulation induced torque, the reference layers 266 and 268 may be placed in the dual state for writing. The spin transfer torque is thereby enhanced. Similarly, the antidual state enhances the magnetoresistance of the magnetic junction 260. Thus, reading and writing of the magnetic junction 260 may be improved. In addition, the extended reference layer 266 may result in reduced stray fields at the free layer 262 and/or better stability for lower coercivities of the free layer. Consequently, performance of the magnetic memory 250' may be improved.

Figure 15:
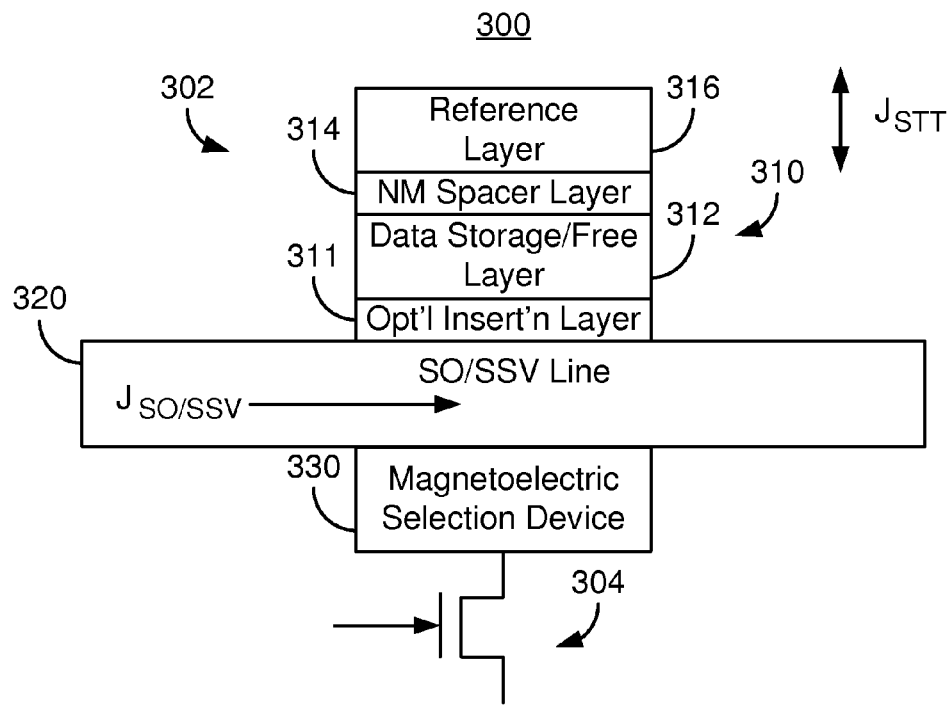
FIG. 15 depicts another exemplary embodiment of a portion of a memory including dual magnetic junctions switched using spin-orbit interaction.

FIG. 15 depicts a side view of another exemplary embodiment of a portion of a magnetic memory 300 that includes magnetic junction 310 switched using spin accumulation based torque. The spin polarized charge carriers may be accumulated due to the spin orbit effect and/or to an SSV configuration of the line 320. The magnetic memory 300 may be used in devices that utilize RAM, particularly MRAM, including but not limited to cellular phones, other mobile devices and computing devices. For clarity, FIG. 15 is not to scale. In addition, portions of the magnetic memory 300 such as bit lines, word lines, row selectors and column selectors are not shown or not labeled as such. The magnetic memory 300 is analogous to the magnetic memories 50, 100, 150, 200, and/or 250. The magnetic memory 300 thus includes a magnetic storage cell 302 and an SO/SSV line 320 analogous to the magnetic storage cell 52/102/152/202/252 and SO/SSV line 120/170, respectively. The magnetic storage cell 302 includes a selection device 330 and a magnetic junction 310. The magnetic junction 310 is analogous to the junctions 60/110/160/210/260, respectively. The selection device 330 may be considered to be analogous to the selection devices 54/104/154/204/254. In some embodiments, the magnetic storage cell 302 may have additional components including but not limited to another magnetic junction and one or more additional selection devices. The magnetic storage cell may be one of a number of magnetic storage cells ordered in an array. Similarly, multiple SO/SSV lines 320 may be used in the magnetic memory 300.

The magnetic junction 310 includes an optional insertion layer 311, a free layer 312, a nonmagnetic spacer layer 314 and a reference layer 316 analogous to optional insertion layer 111/161/211/261, the free layer 112/162/212/262, nonmagnetic spacer layer 114/164/214/164 and reference layer 116/166/216/266, respectively. The free layer magnetic moment may thus be in-plane, perpendicular-to-plane, or in some other direction when the magnetic memory cell 302 is quiescent (e.g. not being programmed). Likewise, the reference layer magnetic moment may be in-plane or perpendicular-to-plane when quiescent. In some embodiments, the magnetic moments of the free layer 312 and reference layer 316 share the same direction. For example, both may be in-plane or both may be perpendicular-to-plane. In other embodiments, the magnetic moment of the free layer 312 may be perpendicular to the reference layer 316 when the magnetic memory cell 312 is quiescent. For example, the free layer magnetic moment may be perpendicular-to-plane while the reference layer magnetic moment is in plane.

The selection device 330 is a magnetoelectric selection device 330. The magnetoelectric selection device 330 may have a high resistivity as compared to the SO/SSV line 320 to prevent shunting of the in-plane current $J_{SO/SSV}$ through the magnetoelectric selection device 330. The magnetoelectric selection device 330 includes one or more ferroelectric materials and at least one magnetic material. The ferroelectric materials may be insulators in which a spontaneous electrical polarization may be generated. This electrical polarization of such ferroelectric materials may be controlled by a voltage selectively applied through the device 304. The device 304 is shown is a transistor. However, in other embodiments, other device(s) may be used. The device 304 may select a line of magnetic memory cells perpendicular to the current direction (i.e. perpendicular to the SO/SSV line 320) or may be specific to the individual memory cell 302. The voltage that controls the ferroelectric material(s) may thus be applied via the line passing through the device 304. The magnetic material(s) in the magnetoelectric selection device 330 may be sensitive to shifts in the Fermi level, local electric fields near their surfaces and/or other effects produced by the ferroelectric materials.

In operation, the ferroelectric materials in the magnetoelectric selection device 330 may be controlled to have surface charges and, therefore, large local fields at their surface. These fields may shift the Fermi level of adjoining ferromagnetic materials and affect the magnetic properties of the ferromagnetic materials. For example, the ferroelectric material may induce a magnetic moment, may change a magnetic moment, may change the Curie temperature (thus changing the magnetic moment at the operating temperature), change the phase in the RKKY interaction of two layers, may affect a magnetic anisotropy in the adjoining materials and/or may have other magnetic effects in magnetic material(s) that are sensitive to the properties of the ferroelectric material. This change in the magnetic properties of the magnetic material(s) in the magnetoelectric selection device 330 may affect charge accumulation in the SO/SSV line 320. For example, the accumulation of spin polarized charge carriers may be enhanced or destroyed/reduced. The spin accumulation based torque may thus be allowed or prevented from use in switching the magnetic memory cell 302. As a result, the magnetic memory cell 302 may be selected or deselected for programming. Thus the magnetoelectric device 330 may switched between two states, in one of which the magnetic memory cell 320 is selected (SELECT state) and in another one it is deselected for programming (DESELECT state). For some embodiments, the magnitude of the magnetic moment of the magnetic material in the magnetoelectric device 330 in the SELECT state might be close to zero or be smaller by a factor of 1.5 to 30 when compared to the magnetic moment of the magnetoelectric device 330 in the DESELECT state. For some embodiments, when the magnetoelectric device 330 is in the SELECT state, the magnetization of the magnetic material in the magnetoelectric device 330 might be along the direction of the spin accumulation in the SO/SSV line 320. For some embodiments, when the magnetoelectric device 330 is in the DESELECT state, the magnetization of the magnetic material in the magnetoelectric device 330 is perpendicular to the direction of the spin accumulation in the SO/SSV line 320. However in other embodiments, the magnetization of the magnetic material in the magnetoelectric device 330 in the SELECT or DESELECT states may be at different angles to the spin accumulation in the SO/SSV line 320.

Operation of the magnetic memory 300 may be analogous to the magnetic memory 50 or the magnetic memory 100, 150, 200 and/or 250 in that an in-plane current, e.g. $J_{SO/SSV}$, may be driven through the SSO/SV line 320. However, selection of the magnetic memory cell to be programmed may be performed in a particular manner by magnetoelectric selection device 330. If the cell 302 is to be programmed, the magnetoelectric selection device 330 may enhance the accumulation of charge carriers in the SO/SSV line 320. If the magnetic memory cell 302 is not to be written, then the magnetoelectric selection device 330 may reduce or leave unchanged the accumulation of spin polarized charge carriers in the SO/SSV line 320. In other embodiments, the magnetoelectric selection device 330 may leave unchanged the accumulation of polarized spins in the SO/SSV line 320 if the cell 302 is to be written. In such embodiments, the magnetoelectric selection device 330 may reduce or destroy the accumulation of spin polarized charge carriers if the cell 302 is not to be programmed. In either case, selection may be made based on the accumulation of spin polarized charge carriers. For the selected cell, the accumulated charge carriers exert a torque on one or more layers of the magnetic junction 310 as discussed above. To complete switching, a CPP current, $J_{STT}$, is driven through the magnetic junction 310. However for some embodiments, only the in-plane current, e.g. $J_{SO/SSV}$, may be required to switch the cell. For a read operation, the read current may be driven through the magnetic junction 310 in the direction of $J_{STT}$.

Thus, the magnetic memory 300 may share the benefits of the memories 50, 100, 150, 200 and/or 250. Further, selection of the cell(s) to be written may be accomplished using a magnetoelectric device.

Figure 16:
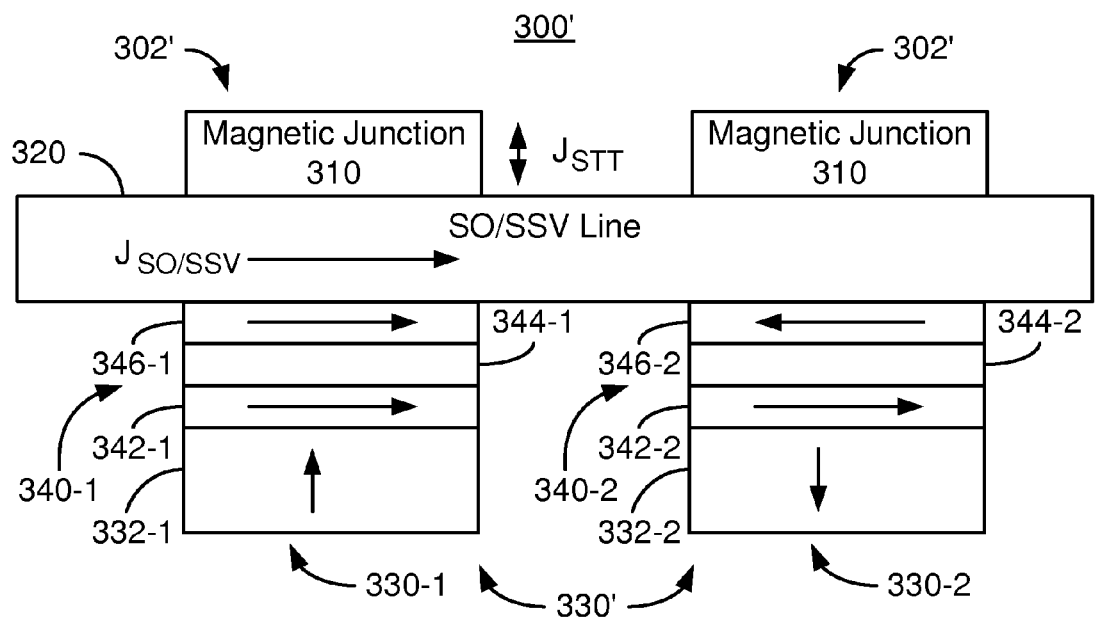
FIG. 16 depicts another exemplary embodiment of a portion of a memory including dual magnetic junctions switched using spin-orbit interaction.

FIG. 16 depicts a side view of another exemplary embodiment of a portion of a magnetic memory 300' that includes magnetic junctions 310 switched using accumulated charge carriers and selected using selection devices 330. The charge carriers may be accumulated due to the spin orbit effect and/or to an SSV configuration of the line 320. The magnetic memory 300' may be used in devices that utilize RAM, particularly MRAM, including but not limited to cellular phones, other mobile devices and computing devices. For clarity, FIG. 16 is not to scale. In addition, portions of the magnetic memory 300' such as bit lines, word lines, row selectors and column selectors are not shown or not labeled as such. The magnetic memory 300' is analogous to the magnetic memory 300. The magnetic memory 300' thus includes magnetic storage cells 302 and an SO/SSV line 320 analogous to the magnetic storage cell 302 and SO/SSV line 320, respectively. The magnetic storage cells 302' include magnetic junctions 310 analogous to the junctions 60/110/160/210/260/310. In some embodiments, the magnetic storage cells 302' may have additional components including but not limited to another magnetic junction and one or more additional selection devices. The magnetic storage cell may be one of a number of magnetic storage cells ordered in an array. Similarly, multiple SO/SSV lines 320 may be used in the magnetic memory 300'.

Also shown in the memory 300' are magnetoelectric selection devices 330'. Because two selection devices are shown, they are labeled as magnetoelectric selection device 330-1 and magnetoelectric device 330-2. Magnetoelectric selection device 330-1 includes ferroelectric layer 332-1 and magnetic device 340-1. The magnetic device 340-1 includes magnetic layers 342-1 and 346-1 separated by a nonmagnetic layer 344-1. Similarly, magnetoelectric selection device 330-2 includes ferroelectric layer 332-2 and magnetic device 340-2. The magnetic device 340-2 includes magnetic layers 342-2 and 346-2 separated by a nonmagnetic layer 344-2. Based on the state of the ferroelectric layers 332-1 and 332-2, the magnetic devices 340-1 and 340-2, respectively, may be in different states. These different states are exemplified in FIG. 16. The ferroelectric materials 330-1 and 330-2 have different polarizations, or states. As a result, the magnetic devices 340-1 and 340-2 also have different magnetic states. In particular, the layers 342-2 and 346-2 have their magnetic moments in opposite directions because of the state of the ferroelectric material 332-2. In contrast, the layers 342-1 and 342-2 have parallel magnetic moments. Based on the state of the magnetic layers 346-1 and 346-2, spin accumulation in the SO/SSV line 320 may be allowed or reduced/destroyed. In other embodiments, the magnetic moments of the layers 34201/342-2 and 346-1/346-2 can be controlled to be parallel or perpendicular based on the states of the ferroelectric layers 332-1 and 332-2.

In operation, the magnetoelectric selection devices 330-1 and 330-2 may be used to select the magnetic memory cells 302' for writing. Based on the states of the magnetic devices 340-1 and 340-2, the accumulation of spin polarized charge carriers may be present or reduced/destroyed. Thus, the desired magnetic memory cells 302' may be magnetoelectrically selected. Thus, using the magnetoelectric selection devices 330-1 and 330-2, different magnetic junctions 310 may be selected for writing. Programming of the magnetic memory 300' may then proceed in an analogous manner to the magnetic memory 300. An in-plane current, e.g. $J_{SO/SSV}$, may be driven through the SSO/SV line 320 and the cell to be written selected by the magnetoelectric selection devices 330'. Thus, the requisite spin polarized charge carriers accumulate in the region of the selected memory cell 302'. To complete switching, a CPP current, $J_{STT}$, is driven through the magnetic junction 310. However for some embodiments, only the in-plane current, e.g. $J_{SO/SSV}$, may be required to switch the cell. For a read operation, the read current may be driven through the magnetic junction 310 in the direction of $J_{STT}$.

Thus, the magnetic memory 300' may share the benefits of the memory 300. Further, selection of the cell(s) to be written may be accomplished using a magnetoelectric device.

Figure 17:
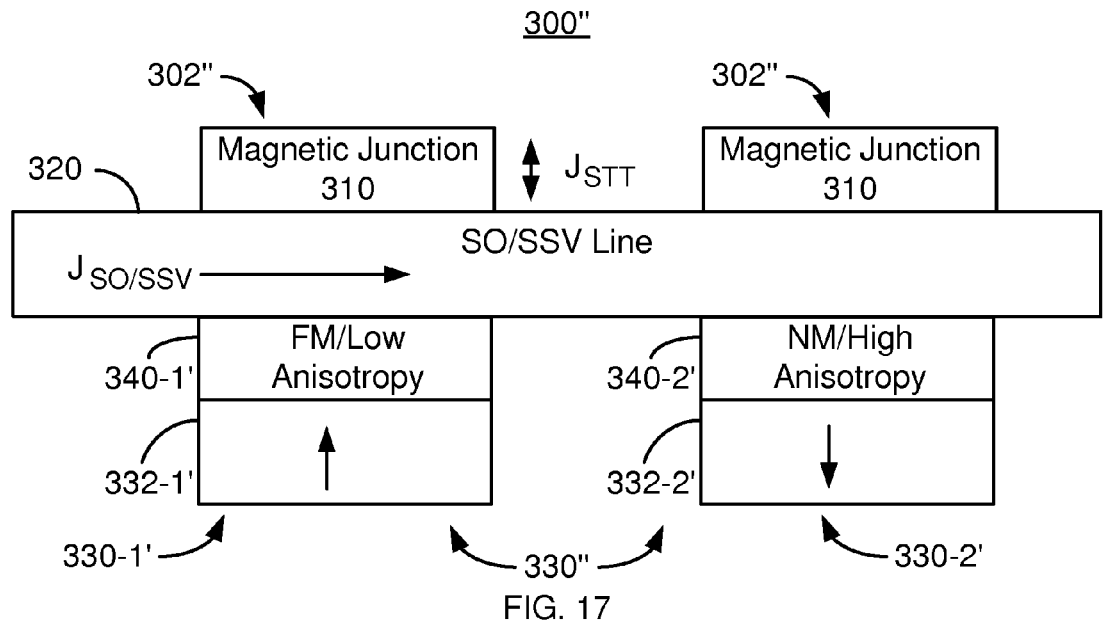
FIG. 17 depicts another exemplary embodiment of a portion of a magnetic memory that includes magnetic junctions switched using accumulated charge carriers and selected using selection devices.

FIG. 17 depicts a side view of another exemplary embodiment of a portion of a magnetic memory 300" that includes magnetic junctions 310 switched using accumulated charge carriers and selected using selection devices 330". The charge carriers may be accumulated due to the spin orbit effect and/or to an SSV configuration of the line 320. The magnetic memory 300" may be used in devices that utilize RAM, particularly MRAM, including but not limited to cellular phones, other mobile devices and computing devices. For clarity, FIG. 17 is not to scale. In addition, portions of the magnetic memory 300" such as bit lines, word lines, row selectors and column selectors are not shown or not labeled as such. The magnetic memory 300" is analogous to the magnetic memory 300. The magnetic memory 300" thus includes magnetic storage cells 302" and an SO/SSV line 320 analogous to the magnetic storage cell 302 and SO/SSV line 320, respectively. The magnetic storage cells 302" include magnetic junctions 310 analogous to the junction 310. In some embodiments, the magnetic storage cells 302" may have additional components including but not limited to another magnetic junction and one or more additional selection devices. The magnetic storage cell may be one of a number of magnetic storage cells ordered in an array. Similarly, multiple SO/SSV lines 320 may be used in the magnetic memory 300".

Also shown in the memory 300" are magnetoelectric selection devices 330'. Because two selection devices are shown, they are labeled as magnetoelectric selection device 330-1' and magnetoelectric device 330-2'. Magnetoelectric selection device 330-1' includes ferroelectric layer 332-1' and magnetic device 340-1'. The magnetic devices 340-1' and 340-2' includes a single layer. Based on the state of the ferroelectric layers 332-1' and 332-2', the magnetic devices 340-1' and 340-2', respectively, may be in different states. The ferroelectric materials 330-1' and 330-2' have different polarizations, or states. As a result, the magnetic devices 340-1' and 340-2' also have different magnetic states. In particular, one embodiment, the magnetic device 340-1' is in a ferromagnetic state at the operating temperature of the memory 300" because of the state of the ferroelectric layer 332-1'. In contrast, the magnetic device 340-2' is in a nonmagnetic state at the operating temperature of the memory 300" because of the state of the ferroelectric layer 332-2'. Thus, the magnetic devices 340-1' and 340-2' transition between magnetic and nonmagnetic states based on the polarization of the ferroelectric layers 332-1' and 332-2', respectively. In other embodiments, the perpendicular anisotropy of the magnetic devices 340-1' and 340-2' may be changed based on the polarization of the layers 330-1' and 330-2', respectively. Thus, the magnetic moments of the magnetic devices 340-1' and 340-2' may be rotated based on the states of the ferroelectric layers 330-1' and 330-33', respectively. For example, the magnetic layer 340-1' may be in plane, while the magnetic layer 340-2' may be perpendicular to plane.

The magnetoelectric selection devices 330-1' and 330-2' may be used to select the magnetic memory cells 302" for writing. Based on the states of the magnetic devices 340-1' and 340-2', the accumulation of spin polarized charge carriers may be present or reduced/destroyed. For example, the magnetic device 340-1' being in the ferromagnetic state prevents or destroys the accumulation of spin polarized charge carriers. The magnetic device 340-2' being nonmagnetic allows for the accumulation of spin polarized charge carriers. In other embodiments, the magnetic moment of the magnetic device 340-2' being perpendicular to plane, allows for the accumulation of spin polarized charge carriers in the line 320. The magnetic moment of the magnetic device 340-1' being in-plane may destroy or prevent the accumulation of spin polarized charge carriers. As a result, the desired magnetic memory cell 302" may be magnetoelectrically selected. Using the magnetoelectric selection devices 330-1' and 330-2', different magnetic junctions 310 may be selected for writing.

Operation of the magnetic memory 300" may then proceed in an analogous manner to the magnetic memory 300. An in-plane current, e.g. $J_{SO/SSV}$, may be driven through the SSO/SV line 320 and the cell to be written selected by the magnetoelectric selection devices 330". Thus, the requisite spin polarized charge carriers accumulate in the region of the selected memory cell 302". To complete switching, a CPP current, $J_{STT}$, is driven through the magnetic junction 310. However for some embodiments, only the in-plane current, e.g. $J_{SO/SSV}$, may be required to switch the cell. For a read operation, the read current may be driven through the magnetic junction 310 in the direction of $J_{STT}$.

Thus, the magnetic memory 300" may share the benefits of the memory 300. Further, selection of the cell(s) to be written may be accomplished using a magnetoelectric device.

Figure 18:
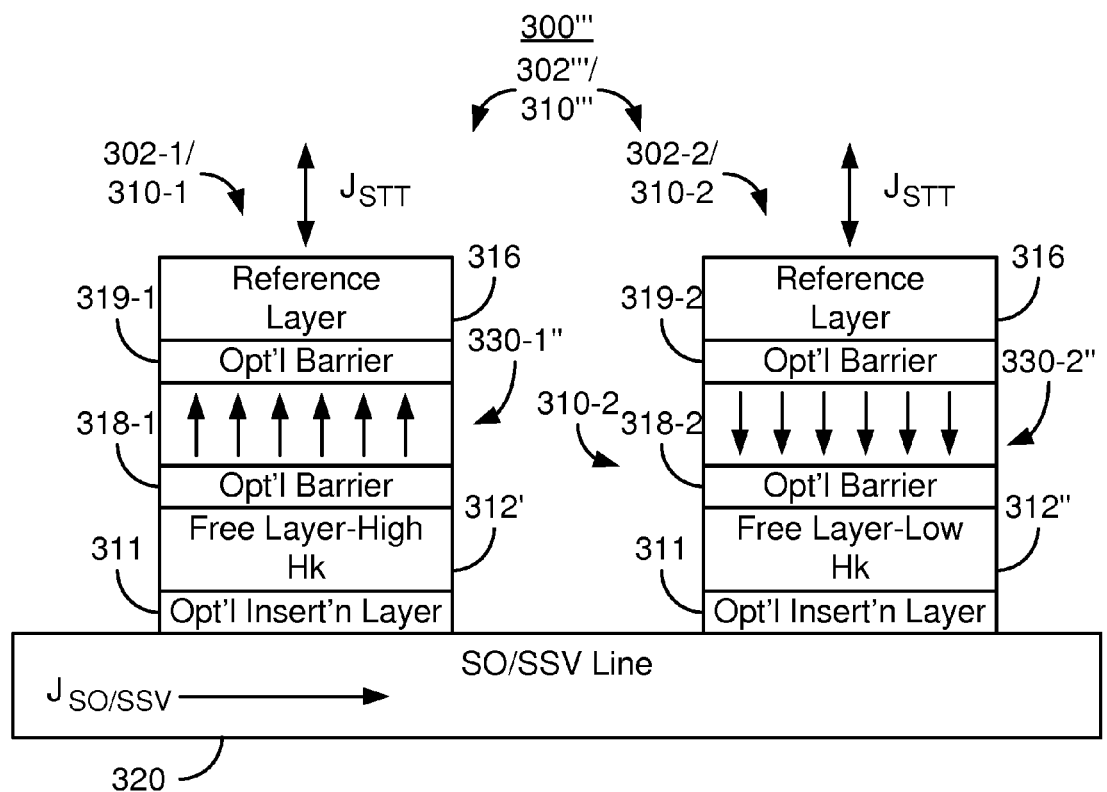
FIG. 18 depicts another exemplary embodiment of a portion of a magnetic memory that includes magnetic junctions switched using accumulated charge carriers and selected using selection devices.

FIG. 18 depicts a side view of another exemplary embodiment of a portion of a magnetic memory 300''' that includes magnetic junctions 310" switched using accumulated charge carriers and selected using magnetoelectric selection devices.

The charge carriers may be accumulated due to the spin orbit effect and/or to an SSV configuration of the line 320. The magnetic memory 300''' may be used in devices that utilize RAM, particularly MRAM, including but not limited to cellular phones, other mobile devices and computing devices. For clarity, FIG. 18 is not to scale. In addition, portions of the magnetic memory 300''' such as bit lines, word lines, row selectors and column selectors are not shown or not labeled as such. The magnetic memory 300''' is analogous to the magnetic memory 300. The magnetic memory 300''' thus includes magnetic storage cells 302''' and an SO/SSV line 320 analogous to the magnetic storage cell 302 and SO/SSV line 320, respectively. The magnetic storage cells 302''' include magnetic junctions 310''' analogous to the junction 310. In some embodiments, the magnetic storage cells 302''' may have additional components including but not limited to another magnetic junction and one or more additional selection devices. The magnetic storage cell may be one of a number of magnetic storage cells ordered in an array. Similarly, multiple SO/SSV lines 320 may be used in the magnetic memory 300'''.

The magnetoelectric selection devices are incorporated into the magnetic junctions 310'''. Thus, magnetic memory cells 302-1 and 302-2 having magnetic junctions 310-1 and 310-2 in different states are shown. The magnetic junction 310-1 includes an optional insertion layer 311 and a reference layer 316 analogous to optional insertion layer 311 and reference layer 316, respectively. The magnetic junction 310-1 also includes a free layer 312', an optional barrier layer 318-1, magnetoelectric selection device 330-1'' and optional barrier layer 319-1. The optional barrier layer 318-1, magnetoelectric selection device 330-1'' and optional barrier layer 319-1 together form a tunneling barrier layer that may be analogous to the nonmagnetic spacer layer 314. The conductance of the magnetic junction 310-1 is thus still desired to be finite and in the range of the magnetic junction 310. Similarly, the magnetic junction 310-2 also includes a free layer 312'', an optional barrier layer 318-2, magnetoelectric selection device 330-2'' and optional barrier layer 319-2. The optional barrier layer 318-2, magnetoelectric selection device 330-2'' and optional barrier layer 319-2 together form a tunneling barrier layer that may be analogous to the nonmagnetic spacer layer 314. The conductance of the magnetic junction 310-2 is still desired to be finite and in the range of the magnetic junction 310. The free layers 312' and 312'' are analogous to the free layer 312 in that the free layers 312' and 312'' are desired to be switchable and used to magnetically store data. The free layer magnetic moments may be in-plane, perpendicular-to-plane, or in some other direction when the magnetic memory cells 302-1 and 302-2 are quiescent (e.g. not being programmed). Likewise, the reference layer magnetic moments for the magnetic junctions 310-1 and 310-2 may be in-plane or perpendicular-to-plane when quiescent. In some embodiments, the magnetic moments of the free layer 312'/312'' and reference layer 316 share the same direction. For example, both may be in-plane or both perpendicular-to-plane.

In the memory 300''' are magnetoelectric selection devices 330-1'' and 330-2'' are ferroelectric layers that work in conjunction with the free layers 312' and 312'' to select the magnetic junctions 310''' for programming. Thus, magnetoelectric selection devices 330-1'' and 330-2'' may be considered to include the free layers 312' and 312'', respectively. The free layer 312' and 312'' have perpendicular magnetic anisotropies that are sensitive to the polarization states of the ferroelectric materials 330-1'' and 330-2'', respectively. The ferroelectric materials 330-1'' and 330-2'' have different polarizations. The free layers 312' and 312'' thus have different magnetic states. In particular, the free layer 312' has a high magnetic anisotropy, while the free layer 312'' has a low magnetic anisotropy.

The magnetoelectric selection devices 330-1'' and 330-2'' select the magnetic memory cells 302''' for writing. Based on the states of the magnetoelectric selection devices 330-1'' and 330-2'', the anisotropy of the free layers 312' and 312'' might be low or high. In particular, the high magnetic anisotropy of the free layer 312' may not be switched by the torque arising due to the accumulation of spin polarized charge carriers in the portion of the SO/SSV line 320 near the free layer 312'. In contrast the low magnetic anisotropy of the free layer 312'' may allow switching the magnetization of this free layer 312' by the torque arising due to the accumulation of spin polarized charge carriers. The desired magnetic junction 310-2 may thus be selected for writing using the states of the magnetoelectric selection devices 330-1'' and 330-2''. Operation of the magnetic memory 300'' may then proceed in an analogous manner to the magnetic memory 300. An in-plane current, e.g. $J_{SO/SSV}$, may be driven through the SSO/SV line 320 and the cell 302-2 to be written selected by the magnetoelectric selection device 330-2''. Thus, the requisite spin polarized charge carriers accumulate in the region of the selected memory cell 302-2. To complete switching, a CPP current, $J_{STT}$, may be driven through the magnetic junction 310-2. For a read operation, the read current may be driven through the magnetic junctions 310'' in the direction of $J_{STT}$.

Thus, the magnetic memory 300''' may share the benefits of the memory 300. Further, selection of the cell(s) to be written may be accomplished using a magnetoelectric device.

Figure 19:
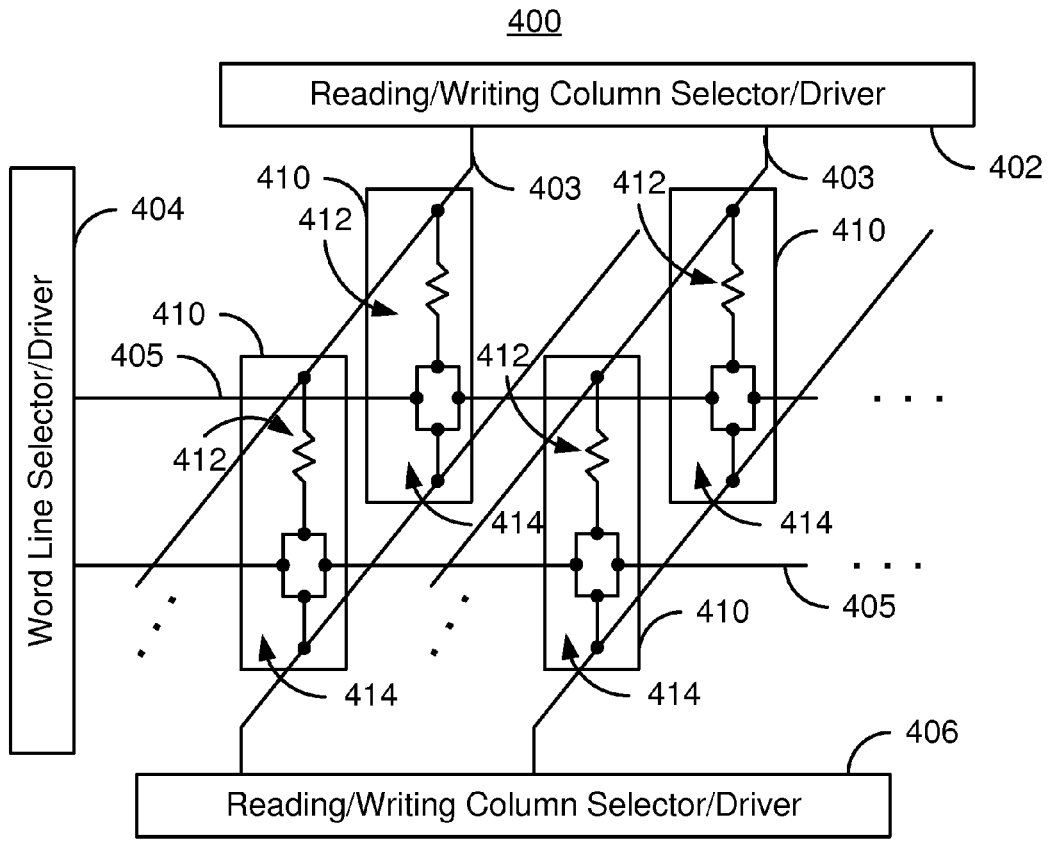
FIG. 19 depicts an exemplary embodiment of a magnetic memory.

The magnetic memories 100, 100', 100'', 100''', 150, 150', 150'', 200, 200', 200'', 250, 250', 300, 300', 300'' and/or 300''' may also be described in the context of circuit diagrams. FIG. 19 depicts an exemplary embodiment of one such memory 400. The magnetic memory 400 includes reading/writing column select drivers 402 and 406 as well as word line select driver 404. Note that other and/or different components having another arrangement may be provided. The storage region of the memory 400 includes magnetic storage cells 410. Each magnetic storage cell includes at least one magnetic junction 412 and at least one selection device 414. In some embodiments, the selection device 414 is a transistor. In other embodiments, the selection device 414 may be or also include magneto electric selection device 330, 330', 330'' and/or 330''-1''/330-2''. The magnetic junctions 412 may include one or more of the magnetic junctions 110, 110', 110'', 110''', 160, 160', 160'', 210, 210', 210'', 260, 260', 310, 310', 310'' and/or 310'''. Although one magnetic junction 412 is shown per cell 410, in other embodiments, another number of magnetic junctions 412 may be provided per cell. Also shown are lines 403 and 405. The lines 403 may be an SO and/or SSV line such as the lines 120, 120', 120'', 120''', 170, 170', 170'', 220, 220', 230'', 270 and/or 320. Thus, the benefits of the magnetic memories 100, 100', 100'', 100''', 150, 150', 150'', 200, 200', 200'', 250, 250', 300, 300', 300'' and/or 300''' may be realized in the memory 400.

Figure 20:
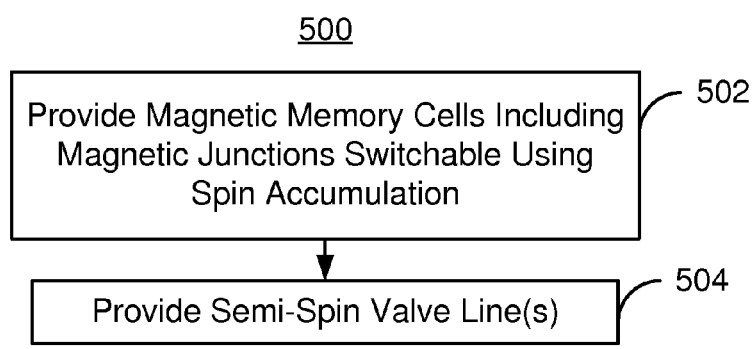
FIG. 20 is a flow chart depicting an exemplary embodiment of a method for providing magnetic junction(s) switched using spin-orbit interaction.

FIG. 20 is a flow chart depicting an exemplary embodiment of a method 500 for providing a magnetic memory having magnetic junction(s) switched using spin-orbit interaction. For simplicity, some steps may be omitted, combined, and/or interleaved. The method 500 is described in the context of the magnetic memory 100. However, the method 500 may be used to provide other magnetic memories including but not limited to the magnetic memories 100', 100'', 100''', 150, 150', 150'', 200, 200', 200'', 250, 250', 300, 300', 300'', 300''' and/or 400.

Magnetic memory cell(s) 102 including magnetic junctions 110 that are switchable using spin accumulation based torque, via step 502. Thus, the magnetic junctions provided in step 502 may include free and/or reference layers for which switching is assisted or completed using a torque induced by the accumulation of spin polarized charge carriers.

SSV line(s) 120 are provided, via step 504. Step 504 thus forms lines having at least one magnetic layer and at least one nonmagnetic layer. The magnetic layer(s) have their magnetic moment(s) in the desired direction(s) with respect to the magnetic moment(s) in the magnetic junctions 110. The thicknesses and materials desired for the magnetic and nonmagnetic layers are thus used. Using the method 500, the benefits of the magnetic memories 100, 100', 100", 100''', 150, 150', 150", 200, 200', 200", 250, 250', 300, 300', 300", 300''' and/or 400 may be achieved.

Figure 21:
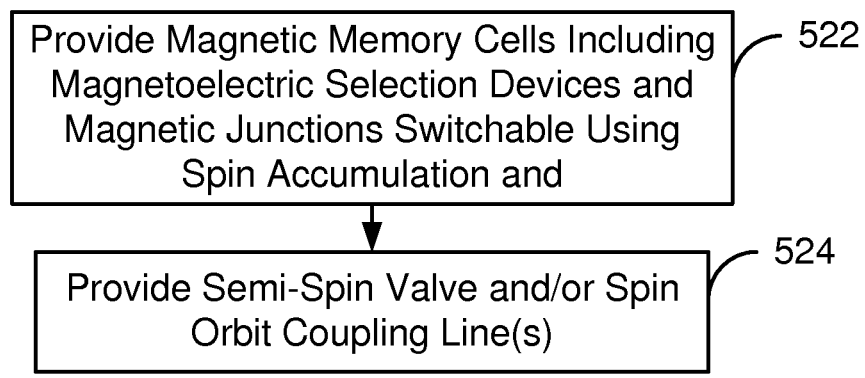
FIG. 21 is a flow chart depicting another exemplary embodiment of a method for providing a magnetic memory having magnetic junction(s) switched using spin-orbit interaction.

FIG. 21 is a flow chart depicting an exemplary embodiment of a method 520 for providing a magnetic memory having magnetic junction(s) switched using spin-orbit interaction. For simplicity, some steps may be omitted, combined, and/or interleaved. The method 520 is described in the context of the magnetic memory 300. However, the method 520 may be used to provide other magnetic memories including but not limited to the magnetic memories 100, 100', 100", 100''', 150, 150', 150", 200, 200', 200", 250, 250', 300', 300", 300''' and/or 400.

Magnetic memory cell(s) 302 including magnetic junctions 310 that are switchable using spin accumulation based torque and magnetoelectric selection devices are provided, via step 522. Thus, the magnetic junctions provided in step 522 may include free and/or reference layers for which switching is assisted or completed using a torque induced by the accumulation of spin polarized charge carriers. Further, the magnetoelectric selection devices 330 are provided in step 522.

SO/SSV line(s) 320 are provided, via step 524. Step 504 thus forms lines for which spins may accumulate near magnetic junction(s) and assist in programming these junctions. Using the method 520, the benefits of the magnetic memories 100, 100', 100", 100''', 150, 150', 150", 200, 200', 200", 250, 250', 300, 300', 300", 300''' and/or 400 may be achieved.

Figure 22:
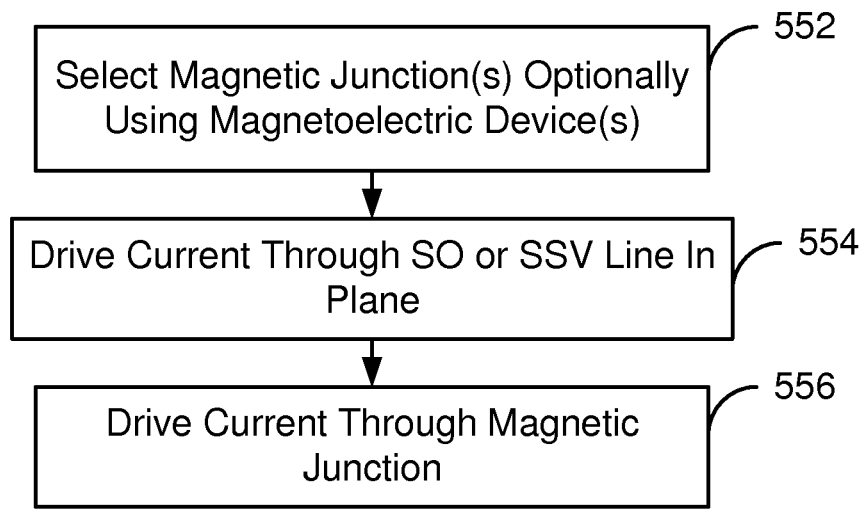
FIG. 22 is a flow chart depicting an exemplary embodiment of a method for programming magnetic junction(s) switched using spin-orbit interaction.

FIG. 22 is a flow chart depicting an exemplary embodiment of a method 550 for programming magnetic junction(s) switched using spin-orbit interaction. The method 550 may be used with one or more of the memories 100, 100', 100", 100''', 150, 150', 150", 200, 200', 200", 250, 250', 300, 300', 300" and/or 300'''. For simplicity, some steps may be omitted, combined, and/or interleaved. The method 550 is described in the context of the magnetic memory 100. However, the method 550 may be used with other magnetic junctions including but not limited to the magnetic memories 100, 100', 100", 100''', 150, 150', 150", 200, 200', 200", 250, 250', 300, 300', 300", 300''' and/or 400.

The magnetic memory cell 102 desired to be written is selected, via step 552. Step 552 may be performed using a magnetoelectric selection device, a transistor, and/or other selection devices.

An in-plane spin-orbit write current is applied through the SO/SSV line 120, via step 554. The magnitude and duration of the in-plane may be sufficient to switch the direction of the magnetic moment of a reference layers or may be used to perturb a moment of the reference or free layer(s).

A CPP spin transfer torque write current is driven through the magnetic junction 110, via step 556. The current in step 556 may also be applied as a pulse. The current pulse applied in step 556 may be desired to be timed with respect to the in-plane current driven in step 554 such that the free layer magnetic moment or reference layer magnetic moment is not at the stagnation at or before the pulse starts. In other embodiments, the timing may be different. Thus, the writing of the cells may be completed.

Thus, using the method 550, the magnetic memories 100, 100', 100", 100''', 150, 150', 150", 200, 200', 200", 250, 250', 300, 300', 300", 300''' and/or 400 may be programmed. Thus, the benefits of the magnetic memories 100, 100', 100", 100''', 150, 150', 150", 200, 200', 200", 250, 250', 300, 300', 300", 300''' and/or 400 may be achieved.

A method and system for providing magnetic memories programmable using spin accumulation induced torque has been described. Various features in the magnetic memories 100, 100', 100", 100''', 150, 150', 150", 200, 200', 200", 250, 250', 300, 300', 300", 300''' and/or 400 may be combined. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic memory comprising:
   a plurality of magnetic junctions, each of the plurality of magnetic junctions including a reference layer, a nonmagnetic spacer layer and a free layer, the free layer being magnetic, the nonmagnetic spacer residing between the free and the reference layer; and
   at least one semi-spin valve (SSV) line adjacent to the plurality of magnetic junctions, the at least one SSV line including a ferromagnetic layer and a nonmagnetic layer between the ferromagnetic layer and the plurality of magnetic junctions, the SSV line configured to exert a spin accumulation induced torque on at least a portion of the plurality of magnetic junctions due to an accumulation of spin polarized current carriers from a current, the current passing through the at least one SSV line in a current direction, the current direction being substantially perpendicular to a direction between the at least one SSV line and the a magnetic junction of the plurality of magnetic junctions closest to at least a portion of the ferromagnetic layer, the free layer being configured to be written using at least the spin accumulation induced torque.

2. The magnetic memory of claim 1 wherein the free layer is closer to the SSV line than the reference layer.

3. The magnetic memory of claim 2 wherein the free layer has an easy axis, the spin accumulation induced torque is substantially parallel to the easy axis, the free layer is configured to be switched using the spin accumulation induced torque and with a zero current driven through the magnetic junction.

4. The magnetic memory of claim 2 wherein the free layer has an easy axis, wherein the spin accumulation induced torque is substantially perpendicular to the easy axis, wherein the spin accumulation induced torque perturbs a free layer magnetic moment from the easy axis and wherein the free layer is further configured to be written using spin transfer.

5. The magnetic memory of claim 1 wherein the reference layer is closer to the SSV line than the free layer and wherein the spin accumulation induced torque is configured to perturb a reference layer magnetic moment, thereby providing a hard axis field on the free layer.

6. The magnetic memory of claim 1 wherein the reference layer is closer to the SSV line than the free layer and wherein the reference layer magnetic moment is configured to be switched using the spin accumulation induced torque and with a zero current driven through the magnetic junction.

7. The magnetic memory of claim 1 wherein the reference layer is closer to the SSV line than the free layer, wherein the each of the plurality of magnetic junctions includes an additional nonmagnetic spacer layer and an additional reference layer, the additional nonmagnetic spacer layer being between the additional reference layer and the free layer, and wherein the spin induced torque is configured to switch a magnetic moment of the reference layer such that the reference layer and the additional reference layer are in a dual state for a write operation and such that the reference layer and the additional reference layer are in an antidual state for a read operation, the free layer being configured to be written using spin transfer.

8. The magnetic memory of claim 7 wherein the reference layer has a first resistance, wherein the each of the plurality of magnetic junctions has a second resistance, the first resistance being less than the second resistance.

9. The magnetic memory of claim 1 wherein the ferromagnetic layer includes at least one of the following elements Fe, Co, Ni, Pt, Pd, Mn, Y, Cr, Ru, Rh, W, Ta, B, Bi, Ir, Pb, B, N, O.

10. The magnetic memory of claim 1 wherein the ferromagnetic layer includes an insulator.

11. The magnetic memory of claim 1 wherein the nonmagnetic layer may include at least one or more of the following elements Cu, Ag, Au, Ta, W, N.

12. The magnetic memory of claim 1 wherein the nonmagnetic layer is at least one nanometer and not more than three nanometers thick and wherein the ferromagnetic layer is at least 0.4 nanometer and not more than ten nanometers thick.

13. The magnetic memory of claim 1 wherein the reference layer has a first dimension in the current direction and wherein the free layer has a second dimension less than the first dimension in the current direction.

14. The magnetic memory of claim 1 further comprising:
at least one magnetoelectric selection device corresponding the plurality of magnetic junctions.

15. A magnetic memory comprising:
a plurality of magnetic memory cells, each of the plurality of magnetic memory cells including at least one magnetic junction and at least one magnetoelectric selection device, each of the at least one magnetic junction having a reference layer, a nonmagnetic spacer layer and a free layer, the free layer being magnetic, the nonmagnetic spacer residing between the free and the reference layer;
at least one spin torque (ST) line adjacent to the plurality of magnetic memory cells, the at least one ST line being configured to exert a spin accumulation induced torque on at least a portion of the plurality of magnetic junctions due to an accumulation of spin polarized current carriers from a current, the current passing through the at least one ST line in a current direction, the current direction being substantially perpendicular to a direction between the at least one ST line and a memory cell of the plurality of memory cells, the free layer being configured to be written using at least the spin accumulation induced torque;
wherein the at least one ST line includes at least one of a spin orbit active line and a semi-spin valve line, the semi-spin valve line including a ferromagnetic layer and a nonmagnetic layer between the ferromagnetic layer and the plurality of magnetic memory cells.

16. The magnetic memory of claim 15 wherein the at least one ST line is between the at least one magnetoelectric selection device and the at least one magnetic junction.

17. The magnetic memory of claim 15 wherein the at least one magnetoelectric selection device is between the reference layer and the free layer of the at least one magnetic junction.

18. The magnetic memory of claim 15 wherein the at least one magnetic junction includes an additional barrier layer between the reference layer and the free layer, the at least one magnetoelectric device being between the nonmagnetic layer and the additional barrier layer.

19. The magnetic memory of claim 15 wherein the at least one magnetoelectric device includes a ferroelectric layer and at least one magnetic layer adjoining the ferroelectric layer, the at least one magnetic layer being between the ferroelectric layer and the ST line.

* * * * *